(12) United States Patent
Tamaki et al.

(10) Patent No.: US 9,175,818 B2
(45) Date of Patent: Nov. 3, 2015

(54) LIGHT-EMITTING APPARATUS AND METHOD FOR MANUFACTURING SAME

(71) Applicant: SHARP KABUSHIKI KAISHA, Osaka-shi, Osaka (JP)

(72) Inventors: Kazuo Tamaki, Osaka (JP); Tohru Ohnishi, Osaka (JP); Toshio Hata, Osaka (JP)

(73) Assignee: SHARP KABUSHIKI KAISHA, Osaka (JP)

( * ) Notice: Subject to any disclaimer, the term of this patent is extended or adjusted under 35 U.S.C. 154(b) by 0 days.

(21) Appl. No.: 14/253,931

(22) Filed: Apr. 16, 2014

(65) Prior Publication Data

US 2014/0225500 A1   Aug. 14, 2014

Related U.S. Application Data

(63) Continuation of application No. 12/706,178, filed on Feb. 16, 2010, now Pat. No. 8,736,160.

(30) Foreign Application Priority Data

Feb. 13, 2009   (JP) .................. 2009-031790

(51) Int. Cl.
*H01J 1/62* (2006.01)
*F21K 99/00* (2010.01)
(Continued)

(52) U.S. Cl.
CPC ... *F21K 9/56* (2013.01); *F21K 9/90* (2013.01); *H01L 24/97* (2013.01); *H01L 33/504* (2013.01);
(Continued)

(58) Field of Classification Search
CPC ........................ H01L 33/504; H01L 33/505

USPC .................................. 313/498–512
See application file for complete search history.

(56) References Cited

U.S. PATENT DOCUMENTS 7,078,732 B1   7/2006  Reeh et al.
2004/0256974 A1  12/2004  Mueller-Mach et al.
(Continued)

FOREIGN PATENT DOCUMENTS

CN  101262032 A   9/2008
JP  2003-46134   2/2003
(Continued)

OTHER PUBLICATIONS

First Office Action mailed May 17, 2012 in Chinese Application No. 201010115754.3, with English translation (7 pages).
(Continued)

*Primary Examiner* — Karabi Guharay
*Assistant Examiner* — Zachary J Snyder
(74) *Attorney, Agent, or Firm* — Nixon & Vanderhye P.C.

(57) ABSTRACT

A light-emitting apparatus including: a substrate; an LED chip mounted on a first surface of the substrate; a fluorescent material-containing layer containing a first fluorescent material, which fluorescent material-containing layer is provided above the first surface of the substrate so as to cover the LED chip; and a color-adjusting fluorescent layer that contains a second fluorescent material, which color-adjusting fluorescent material layer is formed in a layer provided on an outer side of the fluorescent material-containing layer in an emission direction, the color-adjusting fluorescent layer being formed in dots. Thus, the present invention provides a light-emitting apparatus and a method for manufacturing the same, each making it possible to carry out fine color adjustment so as to prevent a subtle color shift that occurs due to a factor such as a difference in concentration of a fluorescent material or the like.

4 Claims, 16 Drawing Sheets

(51) Int. Cl.
*H01L 33/50* (2010.01)
*H01L 23/00* (2006.01)
*H01L 25/075* (2006.01)

(52) U.S. Cl.
CPC ... *H01L 25/0753* (2013.01); *H01L 2224/48091* (2013.01); *H01L 2224/48137* (2013.01); *H01L 2924/12041* (2013.01); *H01L 2933/0041* (2013.01)

(56) References Cited

U.S. PATENT DOCUMENTS

| | | | |
|---|---|---|---|
| 2006/0099449 A1 | 5/2006 | Amano et al. | |
| 2008/0012031 A1 | 1/2008 | Jang et al. | |
| 2008/0048200 A1 | 2/2008 | Mueller et al. | |
| 2008/0231169 A1 | 9/2008 | Hata et al. | |
| 2009/0020773 A1 | 1/2009 | Nomura et al. | |
| 2009/0236618 A1 | 9/2009 | Yasuda | |
| 2009/0286337 A1 | 11/2009 | Lee et al. | |
| 2009/0296369 A1* | 12/2009 | Xu et al. | 362/84 |
| 2010/0127289 A1* | 5/2010 | Helbing et al. | 257/98 |
| 2010/0166407 A1 | 7/2010 | Iwanaga et al. | |

FOREIGN PATENT DOCUMENTS

| | | |
|---|---|---|
| JP | 3546650 | 4/2004 |
| JP | 2006-032726 A | 2/2006 |
| JP | 2006-278741 A | 10/2006 |
| JP | 2006-303373 A | 11/2006 |
| JP | 2007-271822 A | 10/2007 |
| JP | 4030069 | 10/2007 |
| JP | 2008-19380 A | 1/2008 |
| JP | 2008-21988 A | 1/2008 |
| JP | 2008-41699 A | 2/2008 |
| JP | 2008-159705 A | 7/2008 |
| JP | 2008-172152 A | 7/2008 |
| JP | 2008-227458 A | 9/2008 |
| JP | 2008-235824 | 10/2008 |
| JP | 2008-288410 A | 11/2008 |
| JP | 2008-308510 A | 12/2008 |

OTHER PUBLICATIONS

Office Action mailed Jun. 21, 2012 in U.S. Appl. No. 12/706,178 (6 pages).
Office Action mailed Sep. 19, 2012 in U.S. Appl. No. 12/706,178 (12 pages).
Office Action mailed Mar. 12, 2013 in U.S. Appl. No. 12/706,178 (10 pages).
Office Action mailed Sep. 16, 2013 in U.S. Appl. No. 12/706,178 (11 pages).
Notice of Allowance and Fee(s) Due mailed Jan. 28, 2014 in U.S. Appl. No. 12/706,178 (9 pages).

* cited by examiner

LIGHT-EMITTING APPARATUS AND METHOD FOR MANUFACTURING SAME

CROSS REFERENCE TO RELATED APPLICATIONS

This application is a continuation of U.S. application Ser. No. 12/706,178, filed Feb. 16, 2010, now allowed, which claims the benefit of priority to Japanese Patent Application No. 2009-031790 filed on Feb. 13, 2009, the entire contents of each of which are hereby incorporated by reference.

TECHNICAL FIELD

The technology presented herein relates to (i) a light-emitting apparatus that includes a light-emitting element (semiconductor light-emitting device) in combination with a fluorescent material and (ii) a method for manufacturing the light-emitting apparatus. Particularly, the present invention relates to a technique directed to fine color adjustment which causes the light-emitting apparatus to emit light having a given color.

BACKGROUND ART

Conventionally, there is known a light-emitting apparatus that includes a blue LED (light-emitting diode, light-emitting element) in combination with a fluorescent material. In the light-emitting apparatus, light emitted from the blue LED is converted into light having a color such as yellow by the fluorescent material, and then blended with light which has been emitted from the blue LED but has not been subjected to conversion by the fluorescent material, so that light having a given color can be produced. The fluorescent material emits, when irradiated with excitation light emitted from the light-emitting element, fluorescent light having a longer wavelength than the excitation light. In the light-emitting apparatus adopting a configuration described above, light to be emitted has a color and brightness which are varied based on a balance between the light emitted from the blue LED and fluorescent light emitted from the fluorescent material. On this regard, it is important to control the balance between them.

For example, Patent Literature 1 discloses a method for manufacturing a light-emitting apparatus, which method is for manufacturing the light-emitting apparatus by adjusting a brightness of and a color of light to be emitted from the light-emitting apparatus. FIGS. 18(a) through 18(c) are views each showing a step of the method according to Patent Literature 1 for manufacturing a light-emitting apparatus 500.

As shown in FIG. 18(a), a given current is applied to a light-emitting apparatus blank 503 (light-emitting apparatus to which no coating agent is applied) so that white light 504 is emitted, which light-emitting apparatus 503 is formed by: mounting a blue LED 502 on a resin substrate 501; and sealing the blue LED 502 by a resin material containing a fluorescent particle. Then, the white light 504 emitted from a surface of the resin material is measured by a light-emission measurement apparatus 505.

A subsequent step of the method calculates, based on a measurement value of the white light 504 thus obtained by measurement with the light-emission measurement apparatus 505, a pigment particle and a film thickness each contributing to emission of pastel light having a desired intermediate color. The measurement value of the white light 504 is varied in a wavelength component and/or a luminance, depending on (i) a wavelength and a luminance of light emitted from the blue LED 502 constituting the light-emitting apparatus 503 or (ii) a density of the fluorescent particle contained in the resin material.

A subsequent step of the method controls, based on a result from the calculation, an applying apparatus 506 is controlled so that a coating material 507 is sprayed to a surface of the light-emitting apparatus blank 503, as shown in FIG. 18(b). By this, a coating film 508 made from the coating material 507 is formed on the surface of the light-emitting apparatus blank 503, as shown in FIG. 18(c). By above processes, the light-emitting apparatus 500 is manufactured. The light-emitting apparatus 500 can emit, from its surface, the pastel light having the desired intermediate color.

Patent Literature 2 discloses a method for manufacturing a light-emitting apparatus, which method includes: covering a blue LED by a buffer layer (light-transmissive resin); and then applying a fluorescent material to the buffer layer by an ink jet printing method. The method disclosed in Patent Literature 2 provides the blue LED in a package configured in a dot matrix manner, and then forms, above the package, the buffer layer made of an epoxy resin. Subsequently, the method discharges, via an ink jet printer head to only that part of the buffer layer which is formed above an aperture section of the package, alcohol which contains an organic fluorescent dye or a fluorescent particle, so that a fluorescent material is applied on the buffer layer.

After the above, a subsequent step of the method performs scanning by an optical sensor while the blue LED emits light, so as to store, in a memory, pieces of information on a color of the light emitted from the blue LED and on a position of the blue LED. Subsequently, a step of the method compares the color of light thus read out by the optical sensor with a referential color of emission light. In this case, if the fluorescent material is small in amount, the method calculates an amount by which the fluorescent material requires to be applied. Then, based on the amount thus calculated, a step of the method again applies, via the ink jet printer head to that part of the buffer layer which is determined to have the small amount of the fluorescent material, a desired amount of the fluorescent material. By above processes, the color of emission light is adjusted.

CITATION LIST

Patent Literature 1
Specification of Japanese Patent No. 4030069 (Publication Registration Date: Oct. 26, 2007)
Patent Literature 2
Specification of Japanese Patent No. 3546650 (Publication Registration Date: Apr. 23, 2004)

SUMMARY

There is a problem in that with the conventional methods according to Patent Literatures 1 and 2 for manufacturing a light-emitting apparatus, it is impossible to prevent a subtle color shift that occurs due to a factor such as a difference in concentration of the fluorescence material or the like. That is, according to the conventional methods, an entire surface of the emission surface of the light-emitting apparatus is covered by spraying or an ink jet printing method. Therefore, it is harder that fine color adjustment is carried out.

The technology presented herein is made in view of the problem, and a feature of the present technology is to provide (i) a light-emitting apparatus including a light-emitting element in combination with a fluorescent material and (ii) a method for manufacturing the light-emitting apparatus, each allowing fine color adjustment for preventing a subtle color shift that occurs due to a factor such as a difference in concentration of the fluorescent material or the like.

In order to attain the above feature a light-emitting apparatus of an example embodiment presented herein is configured so as to be a light-emitting apparatus including: a substrate; a light-emitting element mounted on a mounting surface of the substrate; a fluorescent material-containing layer containing a first fluorescent material, which fluorescent material-containing layer is provided above the mounting surface of the substrate so as to cover the light-emitting element; a color-adjusting fluorescent layer containing a second fluorescent material, which color-adjusting fluorescent layer is provided on an outer side of the fluorescent material-containing layer in an emission direction, the color-adjusting fluorescent layer being formed in dots.

Further, in order to attain the feature a method according to an example embodiment for manufacturing the light-emitting apparatus is configured so as to be a method for manufacturing a light-emitting apparatus that includes: a substrate; a light-emitting element mounted on a mounting surface of the substrate; a fluorescent material-containing layer containing a first fluorescent material, which fluorescent material-containing layer is provided above the mounting surface of the substrate so as to cover the light-emitting element; and a color-adjusting fluorescent layer containing a second fluorescent material, which color-adjusting fluorescent layer is provided on an outer side of the fluorescent material-containing layer in an emission direction, the method including the steps of: (i) forming the fluorescent material-containing layer on the mounting surface of the substrate so that the fluorescent material-containing layer covers the light-emitting element mounted on the mounting surface of the substrate; (ii) measuring, after the step (i), a color property of light that is emitted from the light-emitting element via the fluorescent material-containing layer; and (iii) forming, based on the color property measured in the step (ii), the color-adjusting fluorescent layer in dots in a layer provided on an outer side of the fluorescent material-containing layer in the emission direction.

According to the configurations above, the color-adjusting fluorescent layer is formed in dots. Thus, fine color adjustment can be carried out so as to adjust, to a target color, a color of light emitted from the light-emitting apparatus. Therefore, it is possible to prevent a subtle color shift that occurs due to a factor such as a difference in concentration of a fluorescent material or the like.

Because the color-adjusting fluorescent layer is formed in dots instead of being formed so as to entirely cover a surface, it is possible to reduce an application amount of the second fluorescent material to a small amount. This further brings about an effect that prevents a deterioration in light beam that occurs due to the second fluorescent material having been applied.

As described so far, the light-emitting apparatus of the example embodiments presented herein is configured so that the color-adjusting fluorescent layer containing the second fluorescent material is formed in dots in a layer provided on an outer side of a fluorescent material-containing layer in the emission direction.

On the other hand, the method according to the present embodiment for manufacturing a light-emitting apparatus includes the steps of: (i) forming the fluorescent material-containing layer on the mounting surface of the substrate so that the fluorescent material-containing layer covers the light-emitting element mounted on the mounting surface of the substrate; (ii) measuring, after the step (i), a color property of light that is emitted from the light-emitting element via the fluorescent material-containing layer; and (iii) forming, based on the color property measured in the step (ii), the color-adjusting fluorescent layer in dots in a layer provided on an outer side of the fluorescent material-containing layer in the emission direction.

Accordingly, the color-adjusting fluorescent layer is formed in dots. Thus, fine color adjustment can be carried out so that a color of light emitted from the light-emitting apparatus is adjusted to a target color of light. This brings about an effect that reduces a subtle color shift that occurs due to a factor such as a difference in concentration of the fluorescent material or the like.

Because the color-adjusting fluorescent layer is formed in dots instead of being formed so as to entirely cover a surface, an application amount of the second fluorescent material can be reduced to a small amount. This further brings about an effect that reduces a deterioration in a light beam that occurs due to the second fluorescent material having been applied.

DESCRIPTION OF EMBODIMENTS

A light-emitting apparatus of the present technology is a light-emitting apparatus including a light-emitting element in combination with a fluorescent material, which light-emitting apparatus includes, on its emission surface, a color-adjusting fluorescent layer for adjusting a difference between (i) a target color of light and (ii) a color of light that is emitted from the light-emitting apparatus, which color-adjusting fluorescent layer is formed by applying a liquid containing a fluorescent material (hereinafter, also referred to as a fluorescent-material containing liquid) by use of a fluorescent material applying apparatus. The following deals with Examples in each of which a fluorescent material applying apparatus, which includes the same basic configuration as an ink jet apparatus developed for use in an ink jet printer, is used. In the fluorescent material applying apparatus, an agent to be applied is not ink but a fluorescent material-containing liquid.

Note that in the present specification, the fluorescent material applying apparatus is referred to as an "ink jet apparatus", which also can be referred to as a jet dispenser. Note also that a method for applying the fluorescent material-containing liquid with the use of the ink jet apparatus is referred to as an "ink jet print method".

(Configuration of Ink Jet Apparatus)

Figure 1:
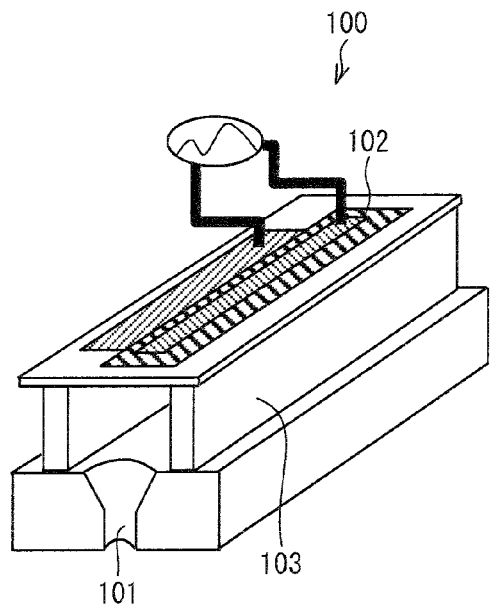
FIG. 1 is a perspective view showing one example of a configuration of an ink jet apparatus.

FIG. 1 is a perspective view showing one example of a configuration of an ink jet printer head 100 that is included in an ink jet apparatus for use in the present invention.

As shown in FIG. 1, the ink jet apparatus includes the ink jet printer head 100 via which a fluorescent material-containing liquid is applied to a targeted object, the fluorescent material-containing liquid containing a particulate fluorescent material. The ink jet printer head 100 is configured such that the fluorescent material-containing liquid, which has been introduced into a fine pressure chamber (chamber 103 into which a fluorescent material-containing resin is introduced), is discharged via a nozzle 101 so as to be applied to the targeted object such as an LED chip.

A method for increasing a pressure in the chamber 103 encompasses (i) a method (piezo method) that operates a piezoelectric device (piezo) 102, and (ii) a method (thermal ink jet method) that instantaneously increases a temperature of a part of the chamber 103 so as to generate bubbles, and discharges the fluorescent material by a pressure of the bubbles.

For application of the particulate fluorescent material, it is preferable to prepare the particulate fluorescent material in a manner suitable for printing by mixing it with a liquid-form resin such as a liquid-form silicone resin or a liquid-form epoxy resin, so that a mixture of the particulate fluorescent material and the liquid-form resin can be applied by the ink jet printing method.

However, in a case where each particle of the particulate fluorescent material is large in size with respect to the nozzle 101, the nozzle 101 may be clogged with the particulate fluorescent material. Also, even in a case where each particle of the particulate fluorescent material is small in diameter with respect to a diameter of the nozzle 101, the nozzle 101 tends to be clogged with the particulate fluorescent material if particles of the particulate fluorescent material are not uniform in diameter.

In consideration of the above, in a case where the particulate fluorescent material is to be applied by the ink jet printing method, it is preferable to filter the particulate fluorescent material so that particles of the particulate fluorescent material have an uniform shape with a diameter of approximately few μm. Further, in the case of application of the particulate fluorescent material by the ink jet printing method, it is more preferable to use the piezo method, which operates the piezoelectric device 102, than to use the thermal ink jet method, which utilizes the bubbles, because the piezo method is applicable to larger particles of the particulate fluorescent material. Note that a liquid fluorescent material, such as a fluid fluorescent pigment, also can be discharged via the ink jet printer head 100 in the ink jet apparatus.

First Embodiment

One embodiment of the present invention is described below with reference to the drawings.

(Configuration of Light-Emitting Apparatus)

FIG. 2(a) is a top view showing one example of a configuration of a light-emitting apparatus 10 in accordance with the present embodiment. FIG. 2(b) is a cross sectional view showing one example of a configuration of the light-emitting apparatus 10 in accordance with the present embodiment.

As shown in FIGS. 2(a) and 2(b), the light-emitting apparatus 10 includes: a substrate 1; LED chips 3 each serving as a light-emitting element; wires 4; a layer 5 that contains a fluorescent material (hereinafter, also referred to as a fluorescent material-containing layer 5); a light-transmissive silicone resin layer 6 (layer that contains no fluorescent material); and a color-adjusting fluorescent layer 7.

It is preferable that the substrate 1 be made from a material, which provides a high reflex of a first surface 2 (mounting surface) of the substrate 1. For example, it is suitable that the substrate 1 be a substrate such as a ceramic substrate. The substrate 1 includes (i), on the first surface 2, surface electrodes for wire bonding, and (ii), on a second surface, a back electrode (which is not illustrated) connectable to an external circuit. Also, the substrate 1 has through-holes (which are not illustrated) via each of which a surface electrode and the back electrode are electrically connected to each other. On the first surface 2 of the substrate 1, (i) the LED chips 3, (ii) the fluorescent material-containing layer 5, (iii) the light-transmissive silicone resin layer 6, and (iv) the color-adjusting fluorescent layer 7 are laminated in this order from the first surface 2.

The LED chips 3 are of a blue LED having an emission peak wavelength of 450 nm, but the present invention is not limited to this. For example, the LED chips 3 can be of an ultraviolet (near-ultraviolet) LED having an emission peak wavelength of 390 nm to 420 nm. This makes it possible to further improve an emission efficiency.

A plurality of the LED chips 3 (4 LED chips 3 in the present embodiment) are mounted (die-bonded) on the first surface 2 of the substrate 1. The LED chips 3 are aligned at equal intervals, for example, and the LED chips 3 are provided at respective given positions that make it possible to satisfy a predetermined amount of light. An LED chip 3 has electrodes (anode electrode and cathode electrode) on its emission surface. The LED chip 3 is mounted on the first surface 2 of the substrate 1 in a way that the emission surface of the LED chip 3 and the first surface 2 of the substrate 1 do not face each other.

The wires 4 are made from, for example, gold. A wire 4 electrically connects the surface electrode of the substrate 1 with an electrode of the LED chip 3, and another wire 4 electrically connects another electrode of the LED chip 3 with an electrode of another LED chip 3 that is provided adjacent to the LED chip 3. By this, it is possible to supply an electrical power to each one of LED chips 3 via the back electrode of the substrate 1.

The fluorescent material-containing layer 5 is formed so as to cover the LED chips 3 and the wires 4. The fluorescent material-containing layer 5 is made from a resin that contains a first particulate fluorescent material (first fluorescent material). A concrete example of the first particulate fluorescent material is to be described later, but the first particulate fluorescent material is a fluorescent material that allows the light-emitting apparatus 10 to emit, in combination with a color of light emitted from the LED chips, light of a predetermined color (chromaticity).

The light-transmissive silicone resin layer 6 is formed in a hemispherical dome shape so as to cover the fluorescent material-containing layer 5 (that is, the LED chips 3, the wires 4, and the fluorescent material-containing layer 5). The light-transmissive silicone resin layer 6 is made from a light-transmissive silicone resin, and is a layer that contains no fluorescent material. The light-emitting apparatus 10 is configured such that a hemispherical dome shaped surface (spherical surface) of the light-transmissive silicone resin layer 6 serves as an emission surface of the light-emitting apparatus 10.

The color-adjusting fluorescent layer 7 is formed in dots on the spherical surface of the light-transmissive silicone resin layer 6. That is, the color-adjusting fluorescent layer 7 is formed in dots in a layer provided on an outer side of the fluorescent material-containing layer 5 in an emission direction. The color-adjusting fluorescent layer 7 is made from a resin that contains a second particulate fluorescent material (second fluorescent material). A concrete example of the second particulate fluorescent material is to be described later, but the second particulate fluorescent material is a fluorescent material that gives a predetermined color (chromaticity) to light emitted from the light-emitting apparatus 10.

(Method for Manufacturing Light-Emitting Apparatus)

Next, the following describes a method for manufacturing the light-emitting apparatus 10 having the configuration described earlier.

FIGS. 3(a) through 3(f) are views each showing a step of a process for manufacturing the light-emitting apparatus 10.

Figure 4:
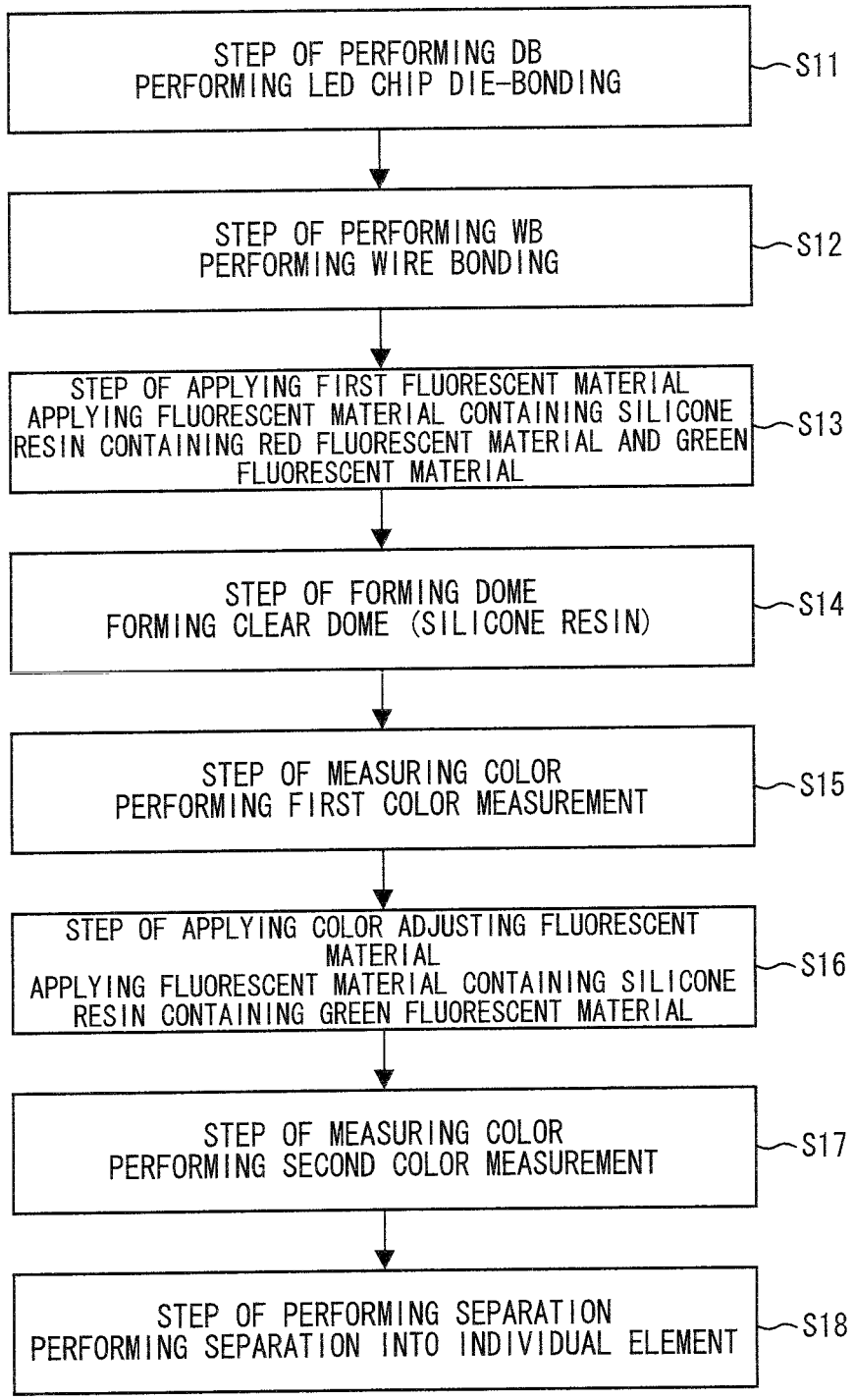
FIG. 4 is a flow chart showing steps of the method for manufacturing the light-emitting apparatus.

FIG. 4 is a flow chart showing steps of the process that includes a color adjustment step to be performed in the light-emitting apparatus 10.

Figure 3:
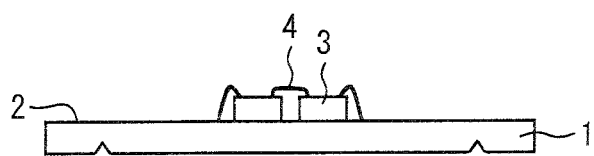
FIG. 3(a) is a view showing a step of a method for manufacturing the light-emitting apparatus.
FIG. 3(b) is a view showing a step of the method for manufacturing the light-emitting apparatus.
FIG. 3(c) is a view showing a step of the method for manufacturing the light-emitting apparatus.
FIG. 3(d) is a view showing a step of the method for manufacturing the light-emitting apparatus.
FIG. 3(e) is a view showing a step of the method for manufacturing the light-emitting apparatus.
FIG. 3(f) is a view showing a step of the method for manufacturing the light-emitting apparatus.
Figure 3:
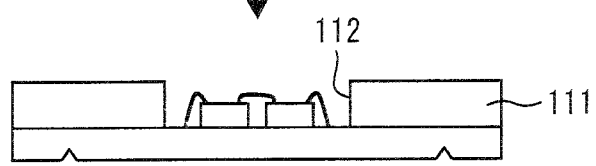
Figure 3:
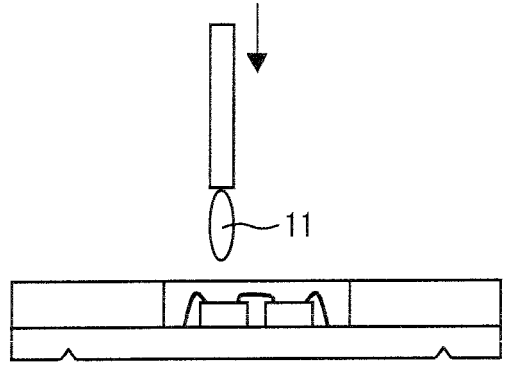
Figure 3:
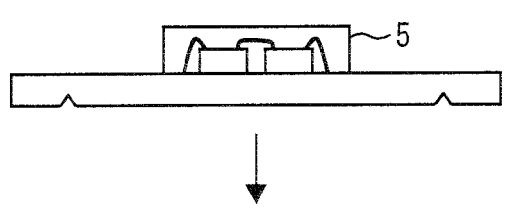
Figure 3:
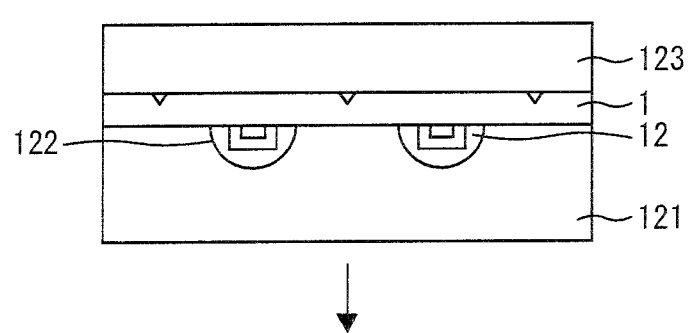
Figure 3:
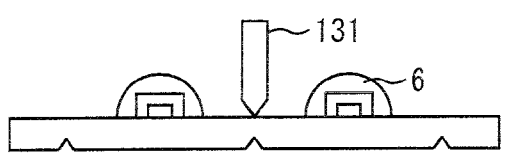

Note that the light-emitting apparatus 10 is first formed in a unit including a group of plural light-emitting apparatuses and then formed as an individual light-emitting apparatus by dicing peripheries (four sides) of each of the plural light-emitting apparatuses and separating the unit of the group of plural light-emitting apparatuses into individual light-emitting apparatuses. In accordance with necessity, members shown in FIG. 3 are simplified to an extent where clarity is reserved.

At first, the LED chips 3 are die-bonded to respective given positions of the first surface 2 of the substrate 1 including members such as the surface electrodes (step S 11).

Then, wire-bonding is carried out by use of the wires 4 (step S 12). In the step S 12, the wire-bonding is carried out sequentially to (i) a part between an electrode of an LED chip 3 and a surface electrode of the substrate 1 and (ii) a part between another electrode of the LED chip 3 and an electrode of another LED chip 3. This provides a configuration as shown in FIG. 3(a).

Then, a resin 11 that contains a fluorescent particle is applied, which resin 11 later constitutes a fluorescent material-containing layer 5 (step S 13). Specifically, as shown in FIG. 3(b), a dam seat 111 is attached on the first surface 2 of the substrate 1, i.e., that surface of the substrate 1 on which the LED chips 3 have been mounted. When the resin 11, which is to be described later, is introduced, the dam seat 111 serves to prevent the resin 11 from flowing and spreading out from a given area. The dam seat 111 has through-holes 112 in each of which an LED chip 3 can be placed. In other words, a shape of the fluorescent material-containing layer 5 is determined based on a shape of the through-holes 112 in the dam seat 111.

The dam seat 111 can be a resin seat to which an adhesive agent is applied on one surface. This resin seat is made from a material such as Teflon (registered trademark), fluoro-rubber, or a silicone sheet. In particular, the fluoro-rubber is preferable because (i) it has a high elasticity, and (ii) the dam seat 111 made from fluoro-rubber can be easily removed. The adhesive agent, on the other hand, is preferably an adhesive agent (i) via which the dam seat 111 can be easily attached to the first surface 2 and (ii) which leaves no residue on the first surface 2 when the dam seat 111 is removed from the first surface 2.

After the dam seat 111 is attached to the substrate 1 so that each of the LED chips 3 is placed in a through-hole 112, the resin 11 is introduced so as to fill the through-hole 112, as shown in FIG. 3(c). The resin 11 is a liquid silicone resin in which a first particulate fluorescent material is dispersed. In the present embodiment, the first particulate fluorescent material is a red fluorescent material $CaAlSiN_3$:Eu and a green fluorescent material $(Si.Al)_6(O.N)_8$:Eu.

Note that the first particulate fluorescent material is not limited to the above. For example, the first particulate fluorescent material can suitably be a material such as BOSE (Ba, O, Sr, Si, Eu). Further, the first particulate fluorescent material can suitably be a material other than BOSE, such as SOSE (Sr, Ba, Si, O, Eu), YAG (Ce-activated yttrium, aluminum, garnet), a sialon ((Ca), Si, Al, O, N, Eu), or β sialon (Si, Al, O, N, Eu). Further, a nanoparticle fluorescent material whose particles have a diameter of 10 nm or smaller (e.g., InP material or GaN material) is suitably used, because such material causes less nozzle clogging.

After introduction of the resin 11, the resin 11 is cured at 150° C. for 120 minutes. Then, the dam seat 111 is removed. By above processes, the fluorescent material-containing layer 5 that covers the LED chips 3 and the wires 4 is formed as shown in FIG. 3(d). A method for removing the dam seat 111 can be a method which holds one end of the dam seat 111 by a jig and then peels off the dam seat 111. With the method, it is possible to remove that the resin 11 which has spread out from the through-hole 112, concurrently with removing the dam seat 111.

After the above, the light-transmissive silicone resin layer 6 is formed (step S 14). Specifically, the hemispherical dome shaped light-transmissive silicone resin layer 6 is formed by using compression molding, as shown in FIG. 3(e).

According to the compression molding, cavities 122 each formed in a female die 121 and having a hemispherical dome shape are filled with a light-transmissive silicone resin 12, which later constitutes the light-transmissive silicone resin layer 6. Subsequently, the substrate 1 is set to the female die 121 so that the fluorescent material-containing layer 5 is placed in the cavities 122. Then, mold clamping is performed by use of a base mold 123, and the substrate 1 is kept at 150° C. for approximately one minute so that the light-transmissive silicone resin 12 is cured. After this, an after cure is carried out at 150° C. for two hours. By above processes, the light-transmissive silicone resin layer 6 having a hemispherical dome shape and covering the fluorescent material-containing layer 5 is formed on the first surface 2 of the substrate 1.

The following step measures a color property of light that is emitted from the light-emitting apparatus thus including the light-transmissive silicone resin layer 6 (step S 15). The color property of light can be measured with a measurement apparatus that adopts a d/8 (diffusion illumination 8° light receiving system) optical system conforming to the condition C of JIS 28722, DIN 5033 teil 7, ISOk772411.

Figure 5:
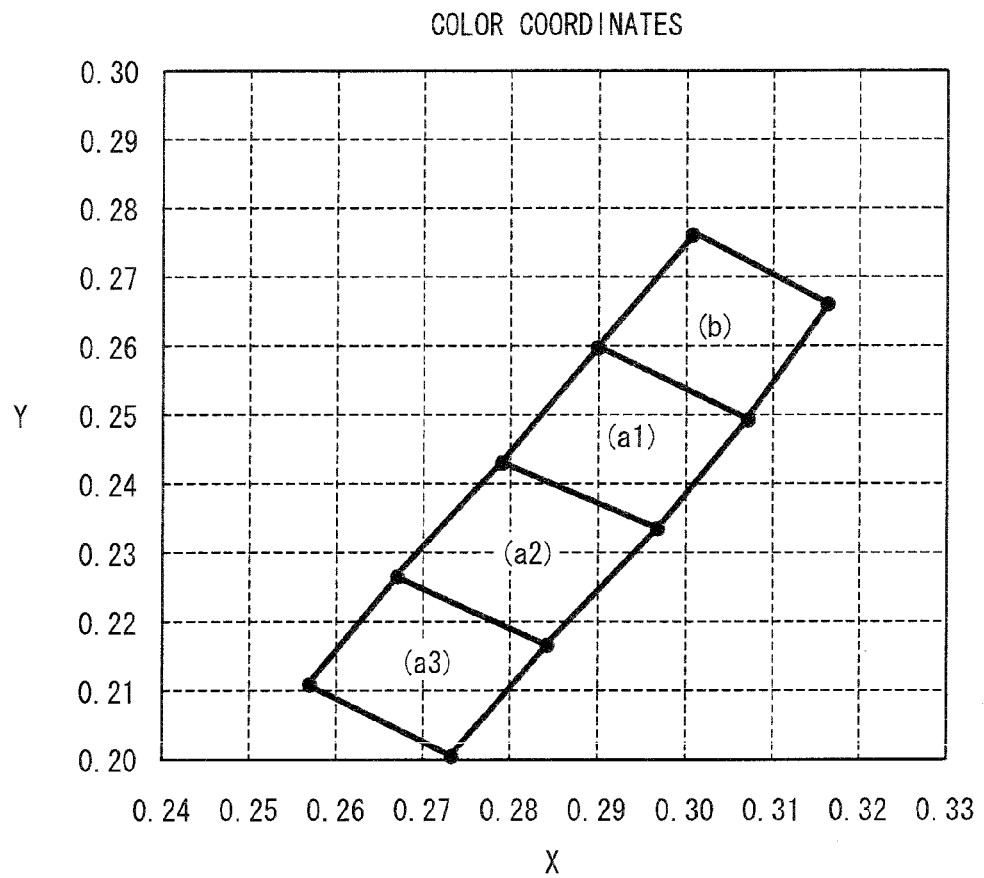
FIG. 5 is a graph showing CIE color coordinates of light emitted from light-emitting apparatuses.

FIG. 5 is a graph in which the CIE color coordinates are shown. Based on the color property of light measured as described above, each light-emitting apparatus (the light-emitting apparatus having been subjected to no color adjustment) thus including the light-transmissive silicone resin layer 6 is categorized into one of color groups represented by color regions (b), (a1), (a2), and (a3) shown in FIG. 5. Note that the number of light-emitting apparatuses which is categorized in none of the four color groups is so small that these light-emitting apparatuses can be disregarded.

For example, with respect to a light-emitting apparatus that is categorized in a color group corresponding to the color region (a1) (central color coordinates (x, y)=(0.292, 0.245)), color adjustment is carried out so that light emitted from the light-emitting apparatus has a color range within the color region (b).

Subsequently, onto the spherical surface of the light-transmissive silicone resin layer 6, a resin liquid (fluorescent material-containing liquid) that contains a second particulate fluorescent material is applied (step S 16), which resin liquid later constitute the color-adjusting fluorescent layer 7. Note that the second particulate fluorescent material and the resin liquid can be selected as appropriate based on a desired color property of light. In some cases, the resin liquid containing the second particulate fluorescent material can additionally contain a light diffusing agent such as an alumina fine particle.

In order that light emitted from a light-emitting apparatus be light of the color region (b) having coordinates (x, y)= (0.303, 0.263), for example, a green fluorescent material $(Si.Al)_6(O.N)_8$:Eu to serve as the second particulate fluorescent material is mixed with a silicone resin to serve as a resin liquid at a weight ratio of 2:100, so that a green fluorescent material-containing resin liquid is produced.

Then, the green fluorescent material-containing resin liquid (fluorescent material-containing resin liquid) is introduced into the chamber 103 of the ink jet printer head 100 shown in FIG. 1, and then discharged via the nozzle 101 so as to be applied onto the spherical surface of the light-transmissive silicone resin layer 6. That is, the green fluorescent material-containing resin liquid is applied onto the spherical surface of the light-transmissive silicone resin layer 6 by the ink jet printing method.

Note however that the green fluorescent material-containing resin liquid is not applied entirely to the spherical surface of the light-transmissive silicone resin layer 6. Instead, the green fluorescent material-containing resin liquid is applied in dots on the spherical surface of the light-transmissive silicone resin layer 6. Specifically, when being viewed downwardly in a direction orthogonal to the first surface 2 of the substrate 1, the green fluorescent material-containing resin liquid is applied in 9 circular dots each having a diameter of 0.5 mm and provided at an interval of 0.34 mm.

Figure 2:
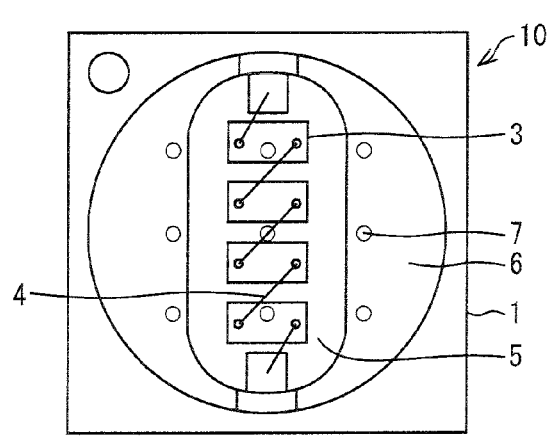
FIG. 2(a) is a top view showing a light-emitting apparatus in accordance with one embodiment.
FIG. 2(b) is a cross sectional view showing the light-emitting apparatus in accordance with the one embodiment.
Figure 2:
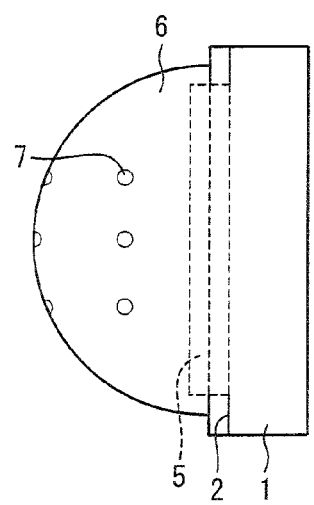

Subsequently, the green fluorescent material-containing resin liquid is cured at 150° C. for 1 hour, so that the color-adjusting fluorescent layer 7 is formed. As shown in FIG. 2, the color-adjusting fluorescent layer 7 is formed in 9 circular dots each having the diameter of 0.5 mm and provided at the interval of 0.34 mm.

The subsequent step measures, with the use of the measurement apparatus as described above and in the same way as described above, a color property of light that is emitted from the light-emitting apparatus thus including the color-adjusting fluorescent layer 7 (step S 17). By this measurement, it is confirmed that the color property of light is within the color region (b). By above processes, the color property of light emitted from the light-emitting apparatus categorized in the color group (a1) is adjusted, so that it is possible to obtain the light-emitting apparatus that is categorized in the color group (b).

At last, the unit including the group of plural light-emitting apparatuses is separated into each individual light-emitting apparatus (step S 18). Separation of the light-emitting apparatuses can be carried out by a method that downwardly cuts the substrate 1, by a cutter 131 from that side of the substrate 1 on which the light-transmissive silicone resin layer 6 has been formed, above a separation groove on the second surface of the substrate 1. According to the method, the light-transmissive silicone resin layer 6 is cut by the cutter 131, and the substrate 1 is broken along the separation groove. Therefore, it is possible to easily separate, into each individual light-emitting apparatus, the light-emitting apparatuses formed in the unit.

By above processes, it is possible to manufacture the light-emitting apparatus 10 individually separated. Because the light-emitting apparatus 10 manufactured in this way has been subjected to the color adjustment so that light to be emitted from the light-emitting apparatus 10 has the target color, the light-emitting apparatus 10 can emit light that is free from the color shift and that has the target color. Further, it is possible to suppress variation in color of the light emitted from the light-emitting apparatus 10, without causing a deterioration in brightness of the light. Thus, a yield rate can be improved.

As described so far, the light-emitting apparatus 10 of the present embodiment is configured so that the color-adjusting fluorescent layer 7, which contains the second particulate fluorescent material, is formed in dots in a layer provided on an outer side in the emission direction with respect to the fluorescent material-containing layer 5 which contains the first particulate fluorescent material.

That is, the light-emitting apparatus 10 is manufactured by the method that includes the steps of: (i) forming the fluorescent material-containing layer 5 on the first surface 2 of the substrate 1 so that the LED chips 3 mounted on the first surface 2 of the substrate 1 are covered by the fluorescent material-containing layer 5 (step S 13 shown in FIG. 4); (ii) measuring, after the step (i), the color property of the light that is emitted from the LED chips 3 via the fluorescent material-containing layer 5 (step S 15 shown in FIG. 4); and (iii) forming, based on the color property measured in the step (ii), the color-adjusting fluorescent layer 7 in dots in the layer provided on an outer side of the fluorescent material-containing layer 5 in the emission direction (step S 16 shown in FIG. 4).

Accordingly, the color-adjusting fluorescent layer 7 is formed in dots. Therefore, it is possible to carry out fine color adjustment so that the light emitted from the light-emitting apparatus 10 has the targeted color. In consideration of the above, it is possible to prevent a subtle color shift that occurs due to a factor such as a difference in density of the fluorescent material. Further, this makes it possible to manufacture the light-emitting apparatus 10 at a good yield rate and a reduced cost.

Additionally, because the color-adjusting fluorescent layer 7 is formed in dots instead of being formed so as to entirely cover the light-transmissive silicone resin layer 6, it is possible to reduce an application amount of the second particulate fluorescent material to a slight amount. Thus, it is possible to prevent a deterioration in a light beam that occurs due to the second particulate fluorescent material having been applied.

(Color Dependency on Emission Angle)

What should be considered in a case where the color-adjusting fluorescent layer 7 is formed in dots is that there is a potential risk that a color distribution of light may be varied, depending on a direction in which the light is emitted. In consideration of this, it is configured such that the light-emitting apparatus 10 of the present embodiment includes four LED chips 3 and the fluorescent material-containing layer 5 that also functions as an optical diffusion layer, so that a color difference of light is less likely to occur regardless of a direction in which light is emitted. This enlarges an effective size of a light source.

The fluorescent material-containing layer 5 functions primarily to change the color of the light to white, and the color-adjusting fluorescent layer 7 formed in dots functions solely to carry out the fine color adjustment to the color of the light. Note that if the light-emitting apparatus 10 is used in a situation where a property of light which depends on an emission angle is of a particular concern, it is preferable that the color-adjusting fluorescent layer 7 be formed in dots which are smaller in diameter but increased in number.

(Spectrum Property)

Figure 6:
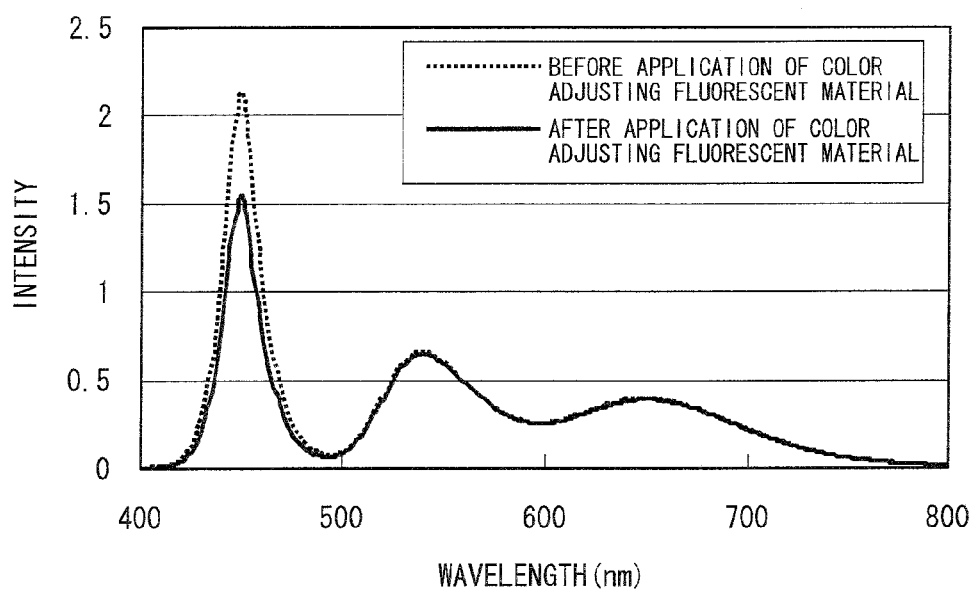
FIG. 6 is a graph showing (i) a spectrum property of light emitted from the light-emitting apparatus including no color-adjusting fluorescent layer and (ii) a spectrum property of light emitted from the light-emitting apparatus including a color-adjusting fluorescent layer.

FIG. 6 is a graph showing (i) a spectrum of light emitted from the light-emitting apparatus 10 that includes no color-adjusting fluorescent layer 7 (in FIG. 6, this is described as "before application of color adjusting fluorescent material"), and (ii) a spectrum of light emitted from the light-emitting apparatus 10 that includes the color-adjusting fluorescent layer 7 (in FIG. 6, this is described as "after application of color adjusting fluorescent material"). In the graph, a wavelength (nm) is shown in the horizontal axis, and a light intensity (relative light intensity) is shown in the vertical axis. The graph shows the spectra each measured in a front direction of the light-emitting apparatus 10.

From FIG. 6, it is clear that blue light is decreased in light intensity after the color-adjusting fluorescent layer 7 has been formed. However, light as a whole is decreased in brightness by merely 2.4% to 3.3%, because (i) a visibility of the blue light is not so high, and (ii) green light, whose visibility is high, has not been decreased in light intensity.

Another Modified Example

Above description of the light-emitting apparatus 10 deals with a case in which the light-emitting apparatus categorized in the color group (a1) is subjected to the fine color adjustment, so that the light-emitting apparatus categorized in the color group (a1) is re-categorized in the color group (b). Note, however, that fine color adjustment can be carried out to a light-emitting apparatus that is categorized in the color group (a2) or the color group (a3).

Figure 7:
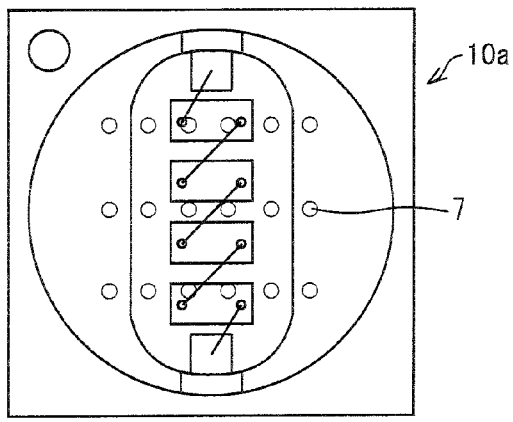
FIG. 7(a) is a top view showing another example of a configuration of the color-adjusting fluorescent layer of the light-emitting apparatus.
FIG. 7(b) is a top view showing still another example of a configuration of the color-adjusting fluorescent layer of the light-emitting apparatus.
Figure 7:
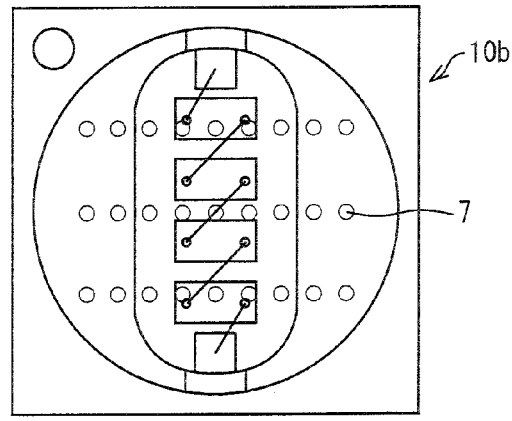

For example, in a light-emitting apparatus categorized in the color group (a2), a color-adjusting fluorescent layer 7 is formed in 18 dots so that the light-emitting apparatus will be re-categorized in the color group (b). FIG. 7(a) is a view showing a light-emitting apparatus 10a in which the color-adjusting fluorescent layer 7 is formed in 18 dots.

On the other hand, in a light-emitting apparatus categorized in the color group (a3), a color-adjusting fluorescent layer 7 is formed in 27 dots so that the light-emitting apparatus will be re-categorized in the color group (b). FIG. 7(b) is a view showing a light-emitting apparatus 10b in which a color-adjusting fluorescent layer 7 is formed in 27 dots. As seen in the above, a color-adjusting fluorescent layer 7 is formed in more dots in a light-emitting apparatus which emits light having a greater color shift.

Note that no color adjustment requires to be carried out in a light-emitting apparatus categorized in the color group (b). Thus, after the step S 15 in which a color property is measured, the steps S 16 and S 17 can be skipped, and a process should be advanced into the step S 18 in which a separation step is carried out. In this case, no color adjusting fluorescent layer 7 is formed in the light-emitting apparatus.

In the light-emitting apparatus 10 described earlier, the color-adjusting fluorescent layer 7 is formed in dots in accordance with the ink jet printing method. However, the present invention is not limited to this. A method such as a dispenser method, a transfer method, or a printing method can be used as long as selective (local) application of a fluorescent material-containing liquid can be carried out.

Second Embodiment

Another embodiment of the present technology is described as follows, with reference to the drawings. Note that the present embodiment is the same as First Embodiment described earlier except a configuration described hereinafter. Note also that for convenience, members operating in the same ways as those shown in the drawings dealt with in First Embodiment are given the same reference numerals, and explanations thereof are omitted.

In the light-emitting apparatus 10 of First Embodiment described earlier, the color-adjusting fluorescent layer 7 is formed through steps of: mixing the second particulate fluorescent material directly with the fluid resin so as to produce the particulate fluorescent material-containing resin liquid; and applying, by the ink jet printing method, the particulate fluorescent material-containing resin liquid in dots on the spherical surface of the light-transmissive silicone resin layer 6.

In the present embodiment, on the other hand, a color-adjusting fluorescent layer 7 contains a fluorescent material-containing resin powder whose particles are made from a second particulate fluorescent material temporarily coated with a resin being in a solid state. The fluorescent material-containing resin powder is mixed with a fluid resin such that a resin liquid which contains the fluorescent material-containing resin powder is produced. Then, the resin liquid is applied in dots on a spherical surface of a light-transmissive silicone resin layer 6 by the ink jet printing method.

(Method for Producing Fluorescent Material-Containing Resin Powder)

The following describes a method for producing a fluorescent material-containing resin powder.

First, a fluid resin is prepared as a material for a resin in the fluorescent material-containing resin powder. Then, the second particulate fluorescent material is added into the fluid resin, so that a mixture of the second particulate fluorescent material and the fluid resin produces a fluorescent material-mixed resin liquid. Note that in a present example, the fluorescent material to be added into the fluid resin is limited to one kind. After this, the fluorescent material-mixed resin liquid is solidified, and then powdered by an apparatus such as a cutting machine so that the fluorescent material-containing resin powder is produced.

Note that a method for mixing the second particulate fluorescent material with the fluid resin so as to produce the fluorescent material-containing resin powder, is not particularly limited. However, it is preferable that the method uses a rotation/revolution mixer. (i) The number of rotation and revolution and (ii) a length of a rotation/revolution time of the rotation/revolution mixer can be set as appropriate based on a combination of the second particulate fluorescent material and the fluid resin.

Note also that a method for producing the fluorescent material-containing resin powder from the fluorescent material-mixed resin having been subjected to hardening, can be a commonly-used method such as a ball mill method or a jet mill method. In such a method as described above, a powdering step can produce the fluorescent material-containing resin powder that has, for example, a spherical shape or an oval shape.

It is preferable that the number of particles of the second fluorescent material to be contained in one particle of the fluorescent material-containing resin powder be 1 to 3. This is because if 4 or more particles of the second fluorescent material are contained in one particle of the fluorescent material-containing resin powder, the particle of the fluorescent material-containing resin powder is increased in size, and the nozzle 101 of the ink jet printer head 100 shown in FIG. 1 may be clogged with the fluorescent material-containing resin powder.

The following deals with one example of processing of the fluorescent material-containing resin powder, by describing a concrete example.

First, a silicone resin was heated to be fluid so that it could be used as a material for a fluid resin. Then, a green fluorescent material $(Si.Al)_6(O.N)_8:Eu$, which was a second particulate fluorescent material, was added into and mixed with the fluid resin made of the silicone resin, so that a fluorescent material-mixed resin liquid was produced. In this case, a mass mixing ratio of the green fluorescent material to the silicone resin in the fluorescent material-mixed resin liquid was 1:4.

For mixing the silicone resin with the green fluorescent material, the rotation/revolution mixer was used. In the present example, the silicone resin and the green fluorescent material were mixed with each other at a frequency of 2000/min for a rotation/revolution time of 3 minutes.

After this, the fluorescent material-mixed resin liquid subjected to the mixture was kept at 100° C. for 1 hour so as to be pre-cured. Subsequently, the fluorescent material-mixed resin liquid was kept at 150° C. for 5 hours so as to be cured, so that a fluorescent material-mixed resin was produced. The fluorescent material-mixed resin was powdered by a cutting machine in accordance with the ball mill method. By above processes, the fluorescent material-containing resin powder was produced.

Note that it is desirable that the fluorescent material-containing resin powder meet the following three conditions, in order that a discharge defect of an ink jet apparatus be prevented and wearing-off of the nozzle 101 be reduced:

(1) a particle of the fluorescent material-containing resin powder has a small diameter of, for example, 50 μm or smaller and preferably 20 μm or smaller;

(2) a particle of the fluorescent material-containing resin powder has a narrow diameter distribution (3) a particle of the fluorescent material-containing resin powder has a shape with no corner, such as a spherical shape or an oval shape.

Figure 8:
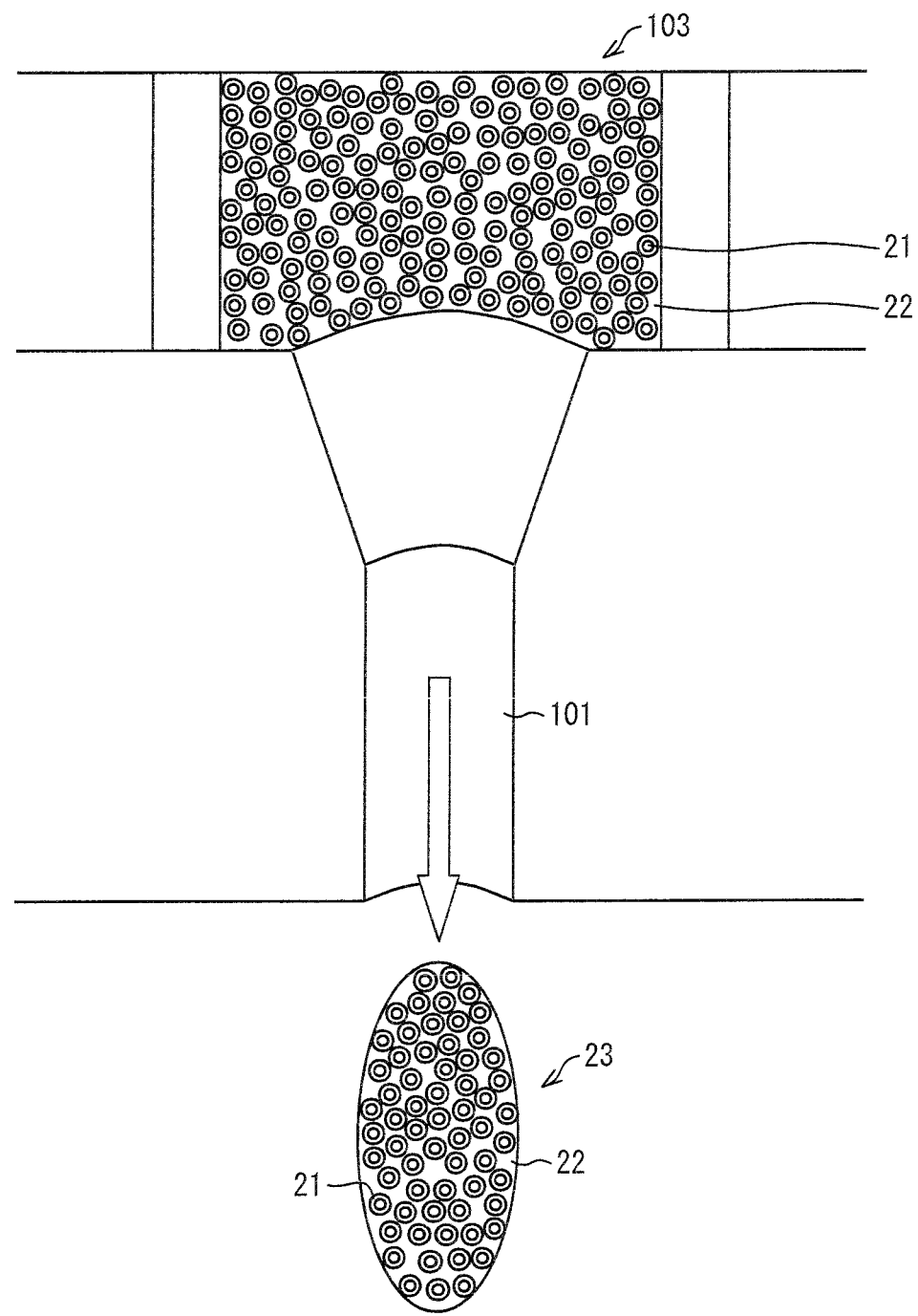
FIG. 8 is a view schematically showing one example of a configuration of the ink jet apparatus for applying a resin containing a fluorescent powder.

FIG. 8 is a view schematically showing the ink jet printer head 100 via which a coating liquid 23 of a color-adjusting fluorescent material is applied. As shown in FIG. 8, (i) a green fluorescent material-containing resin powder 21 that was produced in the above-described way and (ii) a fluid light-transmissive silicone resin 22 were introduced into a tank (chamber 103 in which a fluorescent material-containing resin is introduced), such that the coating liquid 23 (a mixture of the green fluorescent material-containing resin powder 21 and the fluid light-transmissive silicone resin 22) was to be discharged from the nozzle 101.

Figure 9:
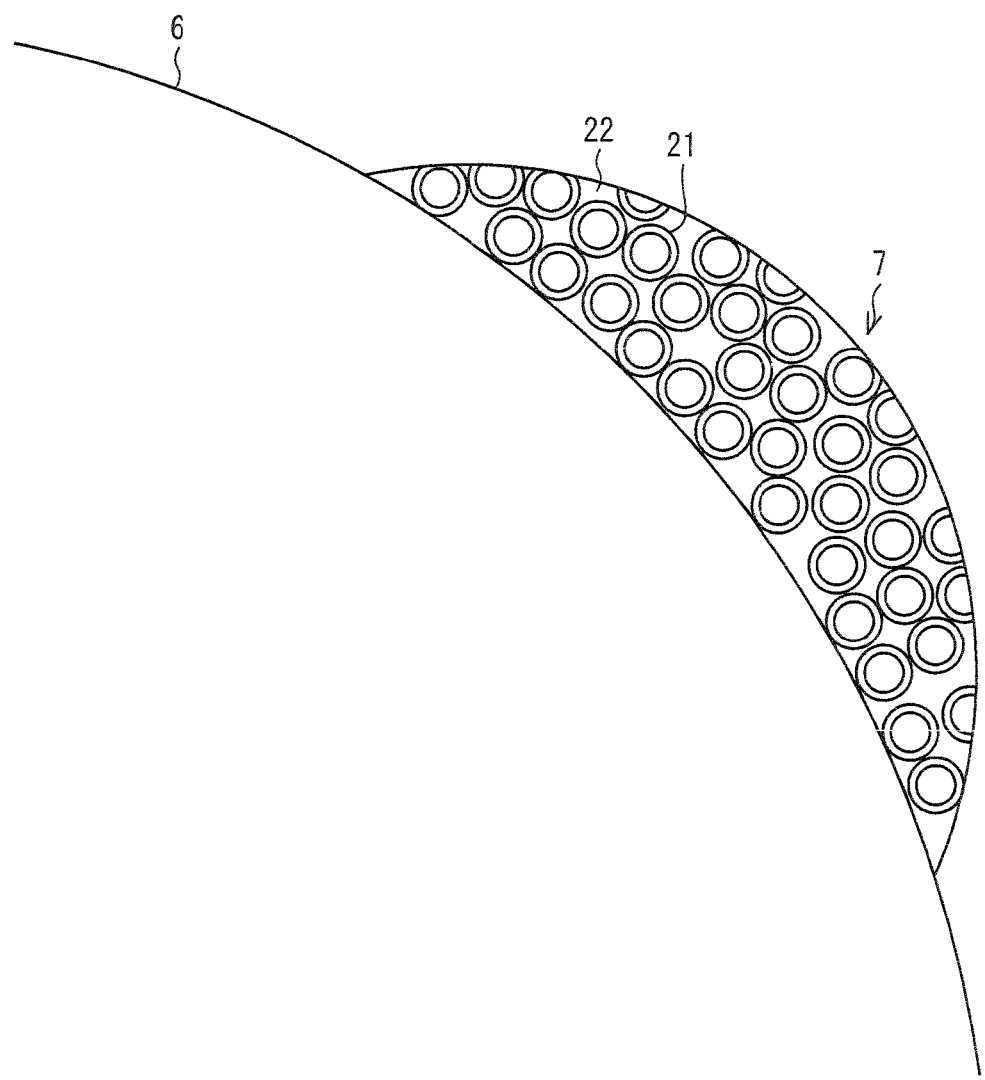
FIG. 9 is an enlarged cross sectional view schematically showing a color-adjusting fluorescent layer that is formed by use of the ink jet apparatus.

FIG. 9 is an enlarged cross sectional view showing the color-adjusting fluorescent layer 7 that was formed by solidifying the coating liquid 23. (i) That resin included in the green fluorescent material-containing resin powder 21 which coated the second particulate fluorescent material and (ii) a resin that coated the color-adjusting fluorescent layer 7 were a same silicone resin. However, these silicone resins have been cured at different timings. Thus, close observation allows an observer to see a boundary, as shown in FIG. 9, between the silicone resins.

In the present example, a first particulate fluorescent material in the fluorescent material-containing layer 5 for covering the LED chips 3 was a red fluorescent material $K_2TiF_6:M$ and the green fluorescent material $(Si.Al)_6(O.N)_8:Eu$. Also, in the present example, the second particulate fluorescent material in the resin powder 21 was the green fluorescent material $(Si.Al)_6(O.N)_8:Eu$.

Generally, the particulate fluorescent material, which had a relative gravity larger than the fluid resin, easily settled out in the fluid resin. Thus, a fluorescent material concentration easily became uneven in the fluid resin contained in a tank (chamber 103) of the ink jet apparatus.

On the other hand, a method using the resin powder of the present example made it possible that a fluorescent material concentration be closer to be uniform in a fluid resin in a tank, because the resin powder of the present example, which had been formed from the particulate fluorescent material temporarily coated with the resin, had a relative gravity close to that of the fluid resin. Thus, it was possible to improve an accuracy of color adjustment to be carried out by the ink jet printing method.

Also, because the resin powder was formed from the particulate fluorescent material temporarily coated with the resin, aggregation of particles of the resin powder could be reduced. Thus, it was possible to prevent the clogging of the nozzle 101 that occurred in discharging of the coating liquid 23 of the color-adjusting fluorescent material. As a result, the coating liquid 23 could be smoothly discharged.

Further, it could be easily configured such that the particles of the resin powder of the present example have an equal size. Thus, by use of the resin powder having an equal particle size, it was possible to perform application of the fluorescent material with high controllability. In addition, by forming the resin powder in a shape with no corners, e.g., a spherical shape, it was possible to reduce the wearing-off of the nozzle 101. By coating, with a resin, a particulate fluorescent material (in particular, β sialon) that had a crystal structure of a nonspherical shape, it was possible to highly effectively reduce the wearing-off of the nozzle 101.

Third Embodiment

Another embodiment of the present technology is described as follows, with reference to the drawings. Note that the present embodiment is the same as First and Second Embodiments described earlier, except a configuration described hereinafter. Also, note that members operating in the same ways as those shown in the drawings dealt with in First or Second Embodiment are given the same reference numerals, and explanations thereof are omitted.

(Configuration of Light-Emitting Apparatus)

Figure 10:
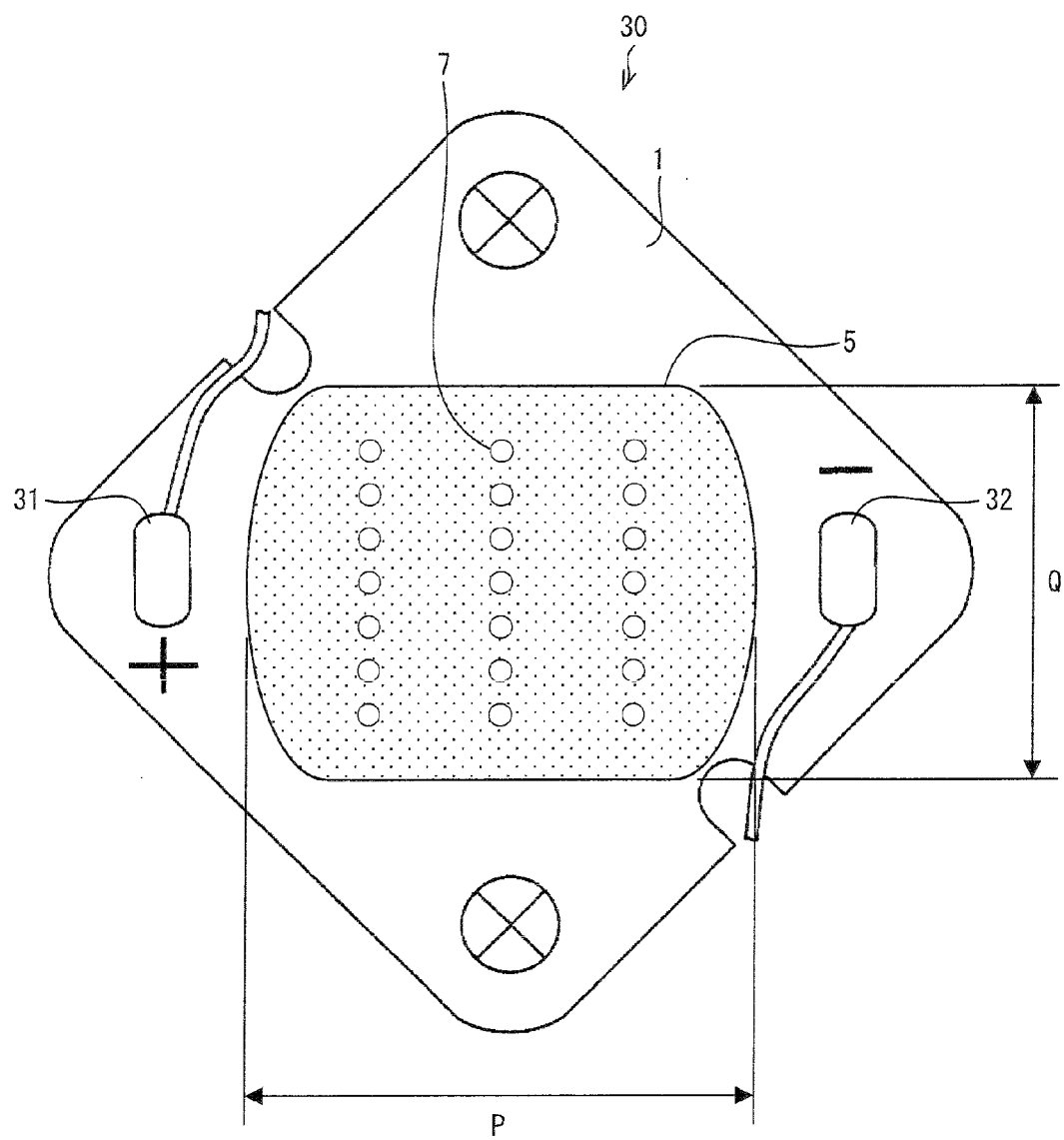
FIG. 10 is a top view showing a light-emitting apparatus in accordance with another embodiment.

FIG. 10 is a top view showing one example of a configuration of a light-emitting apparatus 30 in accordance with the present embodiment.

The light-emitting apparatus 30 of the present embodiment is the same as the light-emitting apparatus 10 of First Embodiment except in that the light-emitting apparatus 30 of the present embodiment includes no light-transmissive silicone resin layer 6. That is, the light-emitting apparatus 30 is configured such that a color-adjusting fluorescent layer 7 partially covers a top surface of a fluorescent material-containing layer 5. In other words, the color-adjusting fluorescent layer 7 is formed in dots.

By forming the color-adjusting fluorescent layer 7 so as to partially cover the fluorescent material-containing layer 5, as described above, it is possible to manufacture the light-emitting apparatus 30 in which partial adjustment to the fluorescent material-containing layer 5 alone can provide a desired color property of light. As described later, it possible, for example, that a light-emitting apparatus 30 which provides light of the color range (b) in color coordinates shown in FIG. 14 be manufactured.

In the light-emitting device 30, a substrate 1 includes a first electrode 31 and a second electrode 32 each being connectable to an external circuit. It is preferable that the fluorescent material-containing layer 5 have a cross section having a hexagonal shape, a circular shape, a rectangular shape, or a square shape. The fluorescent material-containing layer 5 has a rectangular shape when viewed from above. For example, the fluorescent material-containing layer 5 has the rectangular shape with a long side P of 13 mm and a short side Q of 10 mm. In the light-emitting device 30, the top surface of the fluorescent material-containing layer 5 serves as an emission surface.

(Method for Manufacturing Light-Emitting Apparatus)

Next, the following describes a method for manufacturing the light-emitting apparatus 30 including the configuration described above.

FIGS. 12(a) through 12(e) are views each showing a step of the method for manufacturing the light-emitting apparatus 30. FIG. 13 is a flow chart showing steps of the method that includes a color adjustment step to be performed in the light-emitting apparatus 30.

Figure 12A:
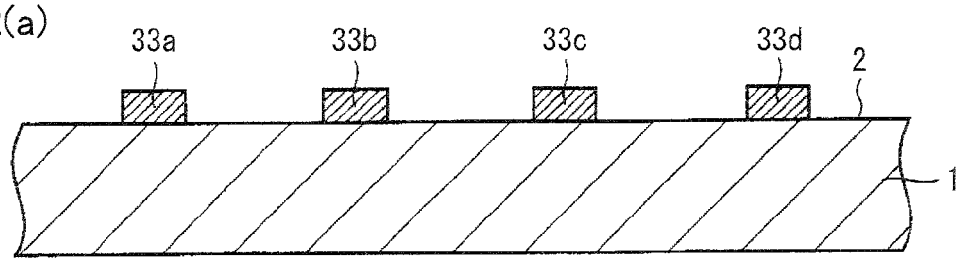
FIG. 12(a) is a view showing a step of a method for manufacturing the light-emitting apparatus.
Figure 13:
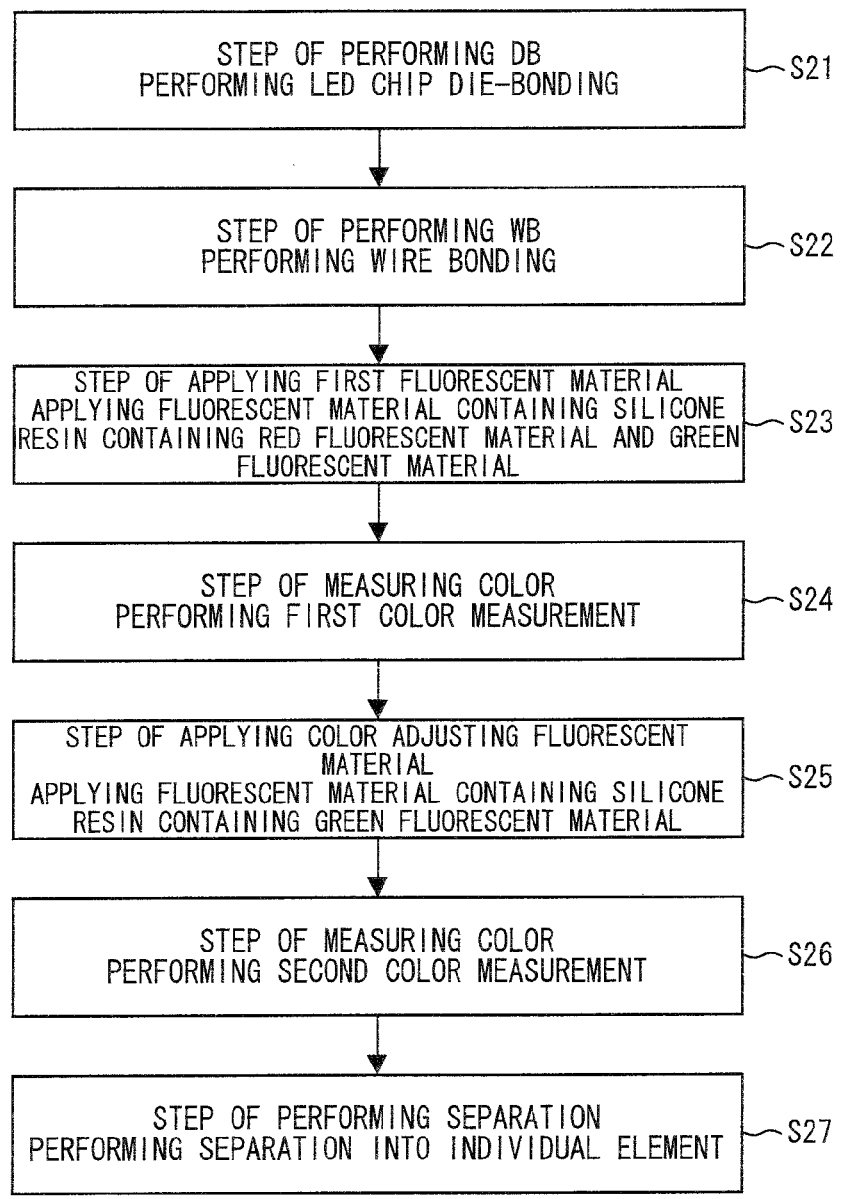
FIG. 13 is a flow chart showing steps of the method for manufacturing the light-emitting apparatus.

First, on a first surface 2 of the substrate 1, four linear wiring patterns 33a through 33d are formed as shown in FIG. 12(a). The wiring patterns 33a through 33d are provided in parallel with each other. A concrete example of a method for forming the wiring patterns 33a through 33d is suitably a method that includes the steps of (i) forming a metal film having a thickness of 0.07 mm onto a first surface 2 of a substrate 1 by spattering, which substrate 1 is a white-color substrate made from aluminum oxide having a thickness of 1 mm, and (ii) forming wiring patterns 33a through 33d (width of 1 mm, interval of 2 mm) by photo etching. Note however that the present invention is not limited to this.

Subsequently, LED chips 3 are mounted in respective intervals in the wiring patterns 33a through 33d (step S 21). Mounting of the LED chips 3 can be carried out by attaching the LED chips 3 directly to the substrate 1 by use of a thermosetting resin such as, for example, an epoxy resin, an acrylic resin, or an imide resin. With the method, it is possible that a withstand voltage, which is determined based on a creeping discharge voltage, be increased as much as possible.

That is, a withstand voltage between one of the LED chips 3 aligned in an electrode direction and another of the LED chips 3 aligned in the electrode direction is determined based on (i) a distance between these LED chips 3 and (ii) a permittivity of the substrate 1. Also, a withstand voltage between one of the LED chips 3 and a corresponding electrode is determined in a similar way, based on a shortest distance between the one of the LED chips 3 and the electrode (wiring patterns 33a through 33d) as well as the permittivity of the substrate 1.

In consideration of the above, a preferable concrete example can be a configuration in which LED chips (each having a width of 0.24 mm, a length of 0.48 mm, and a thickness of 0.14 mm) to serve as the LED chips 3 are fixedly attached, via an epoxy resin, in respective intervals of the wiring patterns 33a through 33d each having a linear shape and formed in parallel with one another on the substrate 1. However, the present invention is not limited to this.

Figure 12B:
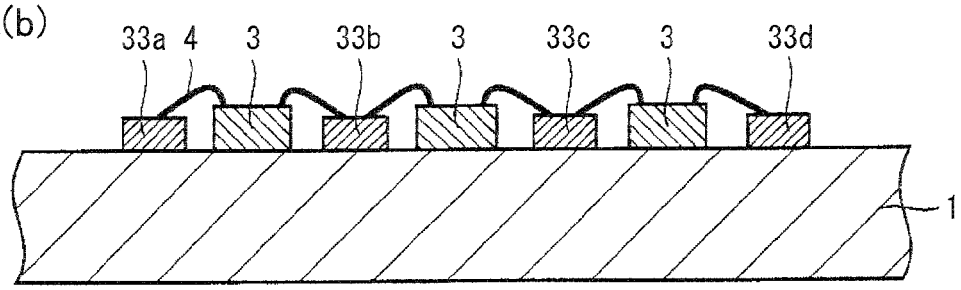
FIG. 12(b) is a view showing a step of the method for manufacturing the light-emitting apparatus.

Then, wire-bonding is carried out by use of the wires 4 (step S 22). In the wire-bonding, as shown in FIG. 12(b), the wiring patterns 33a through 33d are electrically connected to the respective LED chips 3 by the wires 4, based on a desired electrical conduction state.

Note that it is preferable that the method for manufacturing the light-emitting apparatus 30 further include the following steps after electrically connecting the LED chips 3 to the respective wiring patterns 33a through 33d in the above-described way: (i) checking a characteristic of each of the LED chips 3, and (ii), in a case where a characteristic defect is detected by the step (i), electrically connecting a spare LED chip 3 to corresponding ones of the wiring patterns 33a through 33d.

The step (i) can be carried out by, for example, supplying a current to the LED chips 3 and measure optical output characteristics of the respective LED chips 3. Optionally, the step (i) can be carried out concurrently with a visual inspection in which disconnection of a wire 4 and a bonding defect are checked.

Figure 12C:
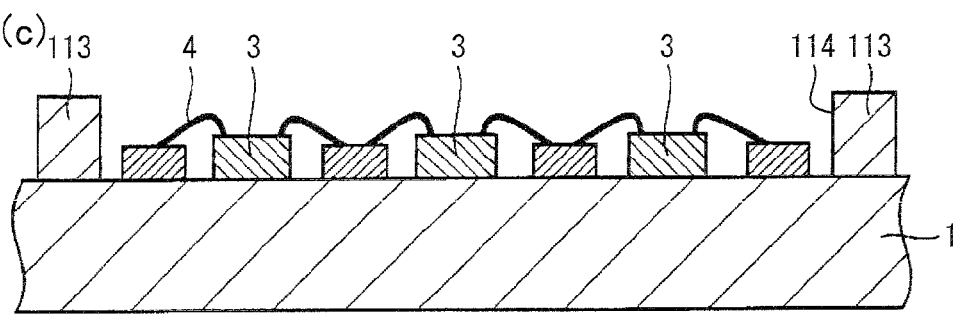
FIG. 12(c) is a view showing a step of the method for manufacturing the light-emitting apparatus.

Subsequently, a resin in which the fluorescent particle is contained is applied, which resin later forms the fluorescent material-containing layer 5 (step S 23). Specifically, the silicone rubber seat 113 is attached onto the first surface 2 of the substrate 1 at first, as shown in FIG. 12(c). The silicone rubber seat 113 has a through-hole 114 for providing a space for forming a sealing member. The through-hole 114 is not particularly limited in shape, and the through-hole 114 can have a shape which is determined based on a cross sectional shape of the sealing member to be formed.

As described earlier, it is preferable that the fluorescent material-containing layer 5 have a cross section of a hexagonal shape, a circular shape, a rectangular shape, or a square shape. In consideration of this, it is preferable that the silicone rubber seat 113 have the through-hole 114 of a hexagonal shape, a circular shape, a rectangular shape, or a square shape.

The silicone rubber seat 113, which is easily available, is made from rubber and has an elasticity. Thus, it is possible to firmly attach the silicone rubber seat 113 even to a bump, such as the wiring pattern, without leaving any space. Further, the silicone rubber seat 113 can prevent a leakage of the fluorescent material-containing resin which is to be described later. Additionally, because the silicone rubber seat 113 can be easily removed after the sealing member is formed, it is preferable to apply a two-sided adhesive sheet entirely on a surface of the silicone rubber seat 113 and attach the silicone rubber seat 113 to the substrate 1 via the two-sided adhesive sheet.

Figure 12D:
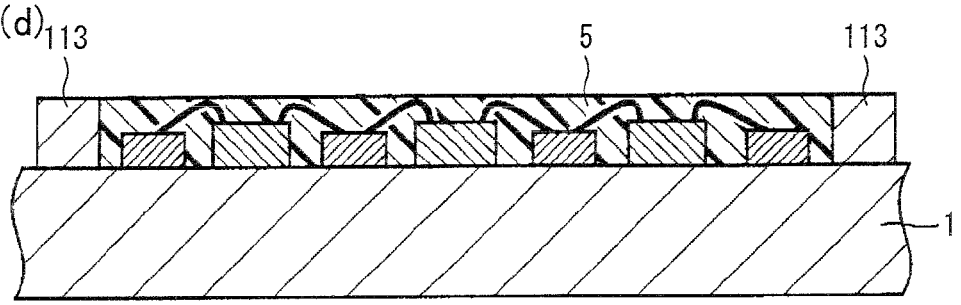
FIG. 12(d) is a view showing a step of the method for manufacturing the light-emitting apparatus.

As shown in FIG. 12(d), after the silicone rubber seat 113 has been attached onto the substrate 1, the through-hole 114 is filled with the fluorescent material-containing resin that serves to seal the LED chips 3, and then, the fluorescent material-containing resin in the through-hole 114 is cured so as to form the fluorescent material-containing layer 5.

A subsequent step of the method measures a color property of light that is emitted from the light-emitting apparatus thus including the fluorescent material-containing layer 5 (step S 24). The color property of light can be measured with a measurement apparatus that adopts a d/8 (diffusion illumination 8° light receiving system) optical system conforming to the condition C of JIS Z8722, DIN 5033 teil 7, ISOk 772411.

Figure 14:
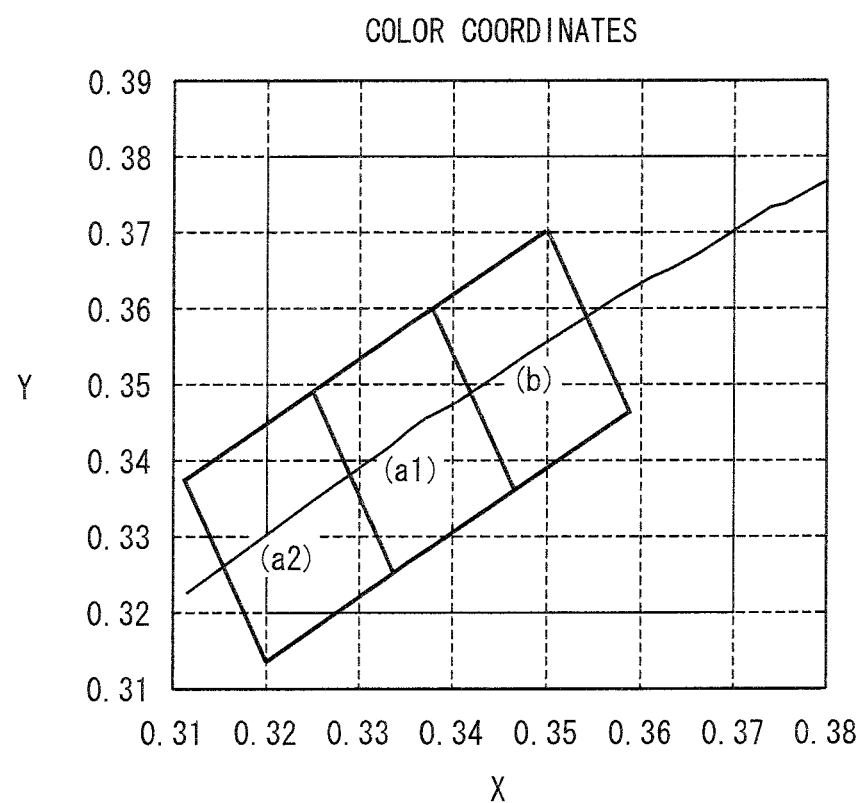
FIG. 14 is a graph showing CIE color coordinates of light emitted from the light-emitting apparatuses.

FIG. 14 is a graph showing CIE color coordinates. For example, there is a case where the previous step (step S 23) has formed the fluorescent material-containing layer 5 in the following process so that the light-emitting apparatus will emit light of the color region (a1) having color coordinates (x, y)=(0.333, 0.338). The process in this case includes the steps of (i) pouring, into the through-hole 114 in the silicone rubber seat 113, the fluorescent particle-containing resin that has been produced by mixing the first particulate fluorescent material (red fluorescent material CaAlSiN$_3$:Eu and green fluorescent material (Si.Al)$_6$(O.N)$_8$:Eu)) with the silicone resin to serve as the fluid resin, at a weight ratio of 5:100, and (ii) thermally curing the fluorescent particle-containing resin thus poured, at 150° C. for 30 minutes. In such a case, light emitted from the light-emitting apparatus will be of one of color groups of the color regions (b), (a1), and (a2) shown in FIG. 14.

In the light-emitting apparatus that is categorized into the color group corresponding to the color region (a1) or the color region (a2), the color-adjusting fluorescent layer 7 is formed on a first surface (top surface, emission surface) of the fluorescent material-containing layer 5 so that the light will have a color of the color region (b). That is, a resin liquid (fluorescent material-containing liquid) containing the second particulate fluorescent material is applied onto the top surface of the fluorescent material-containing layer 5 (step S 25), which resin liquid later forms the color-adjusting fluorescent layer 7.

The second particulate fluorescent material and the resin liquid for constituting the color-adjusting fluorescent layer 7 can be selected from the first particulate fluorescent material and the resin liquid for constituting the fluorescent material-containing layer 5, as appropriate based on a desired color property. In some cases, the second particulate fluorescent material and the resin liquid for constituting the color-adjusting fluorescent layer 7 can be selected from the first particulate fluorescent material and the resin liquid for constituting the fluorescent material-containing layer 5, into which an optical diffusing agent is added.

In the example described earlier, the light-emitting apparatus was configured as follows so that it was possible to obtain light of the color region (b) which had color coordinates (x, y)=(0.345, 0.350) in the CIE color coordinates. The second particulate fluorescent material was, for example, the green fluorescent material (Si.Al)$_6$(O.N)$_8$:Eu, and the resin liquid was, for example, the fluid silicone resin. The second particulate fluorescent material and the resin liquid were mixed with each other at a weight ratio of 2:100 so that the fluorescent material-containing liquid was produced. Then, the fluorescent material-containing liquid was applied onto the fluorescent material-containing layer 5 by the ink jet printing method.

The fluorescent material-containing liquid was applied in circular dots each having a diameter of 0.5 mm and provided at an interval of 0.34 mm. Into a light-emitting apparatus categorized in the color group (a1), the fluorescent material-containing liquid was applied in 21 dots. On the other hand, into a light-emitting apparatus categorized in the color group (a2), the fluorescent material-containing liquid was applied in 42 dots. As seen in the above, the fluorescent material-containing liquid was applied in more dots in a light-emitting apparatuses which emits light having a greater color shift.

Figure 11:
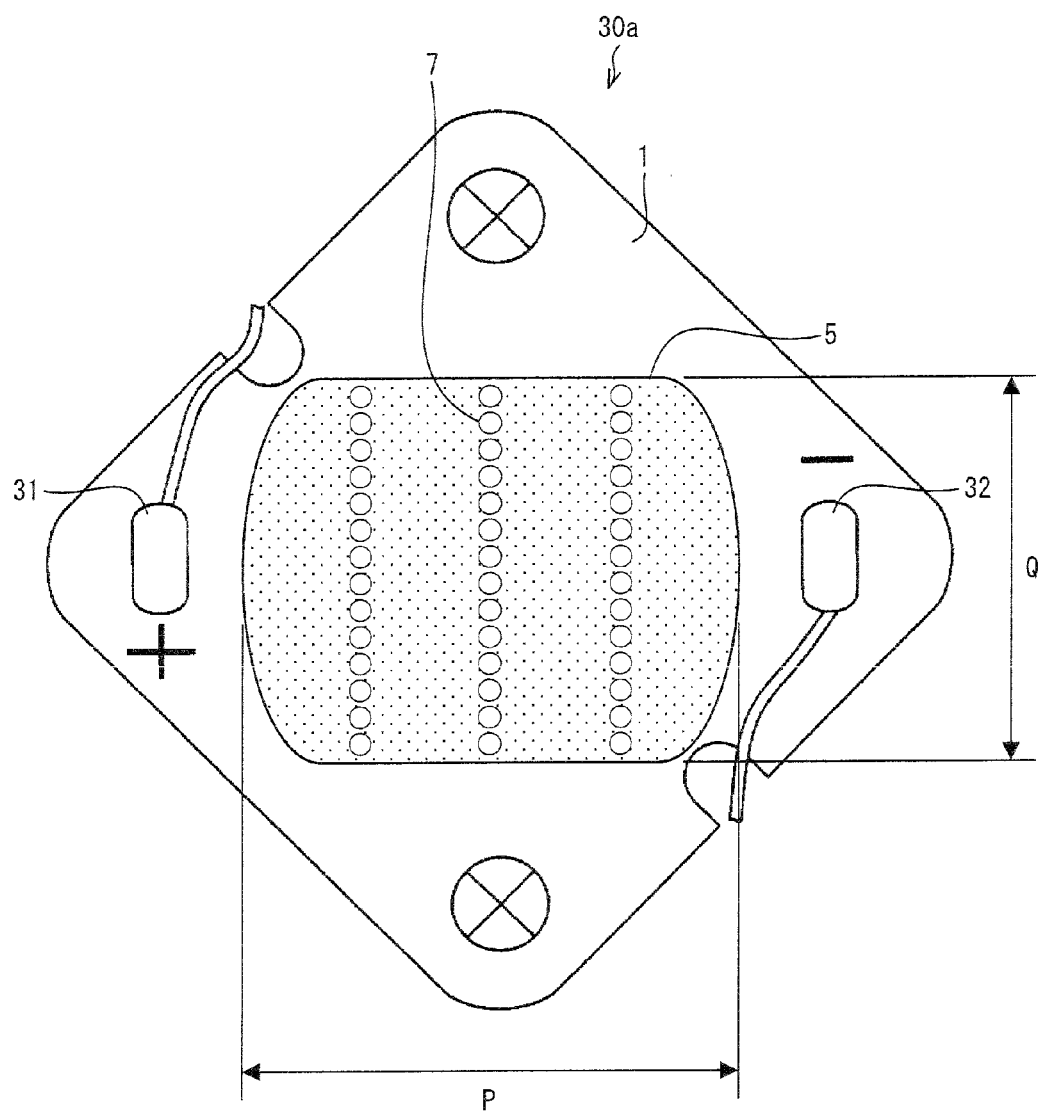
FIG. 11 is a top view showing another example of a configuration of a color-adjusting fluorescent layer in the light-emitting apparatus.
Figure 12E:
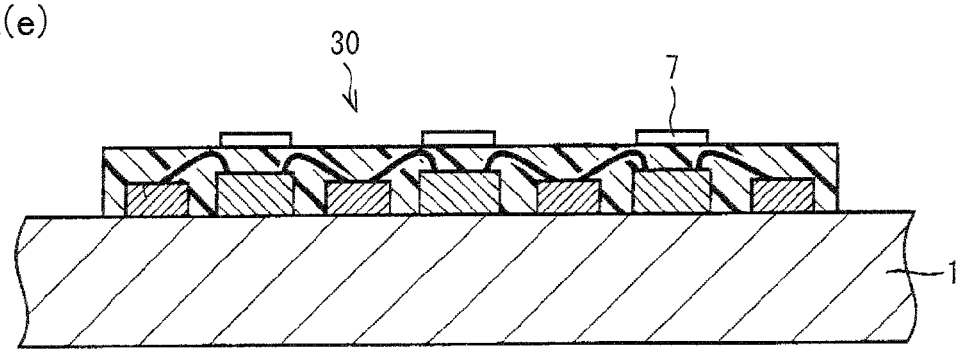
FIG. 12(e) is a view showing a step of the method for manufacturing the light-emitting apparatus.

After the above, (i) the fluorescent material-containing liquid was cured at 150° C. for 1 hour, and then, (ii) the silicone rubber sheet 113 was removed, so that the color-adjusting fluorescent layer 7 was formed as shown in FIG. 12(e). FIG. 10 is a view showing the light-emitting apparatus 30 including the color-adjusting fluorescent layer 7 that had been formed in 21 dots. On the other hand, FIG. 11 is a view showing the light-emitting apparatus 30a including the color-adjusting fluorescent layer 7 that had been formed in 42 dots. As seen in the above, the color-adjusting fluorescent layer 7 was formed in more dots in a light-emitting apparatus which emits light having a greater color shift.

A subsequent step of the method measured, by use of the measurement apparatus as described above and in the same way as described above, a color property of light emitted from the light-emitting apparatus thus including the color-adjusting fluorescent layer 7 (step S 26). By this measurement, it was confirmed that a color property of the light was in the color region (b). By above processes, it was possible to manufacture the light-emitting apparatus 30 that emits light of the color group (b).

At last, separation into individual light-emitting apparatuses was carried out (step S 27). This allowed manufacturing of the light-emitting apparatus 30 thus separated into an individual apparatus. As described so far, by forming the color-adjusting fluorescent layer 7 in dots whose number is changed based on a color shift, it is possible to manufacture the light-emitting apparatus 30 in which light has no color shift, at a good yield rate and a reduced cost.

Fourth Embodiment

Another embodiment of the present technology is described as follows, with reference to the drawings. Note that the present embodiment is the same as First through Third Embodiments described earlier except a configuration described hereinafter. Note also that members operating in the same ways as those shown in the drawings dealt with in any of First through Third Embodiments are given the same reference numerals, and explanations thereof are omitted.

(Configuration of Light-Emitting Apparatus)

Figure 15:
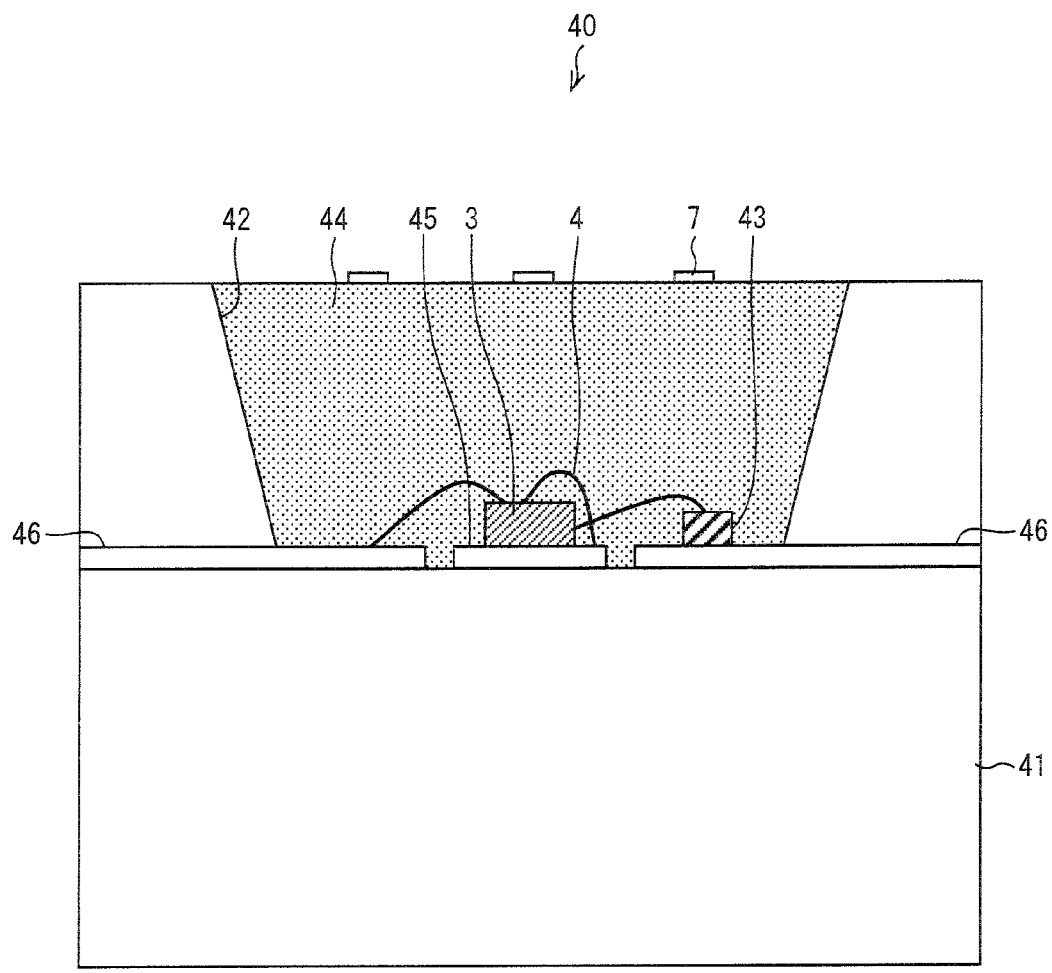
FIG. 15 is a cross sectional view showing a light-emitting apparatus in accordance with still another embodiment of the present invention.
Figure 16:
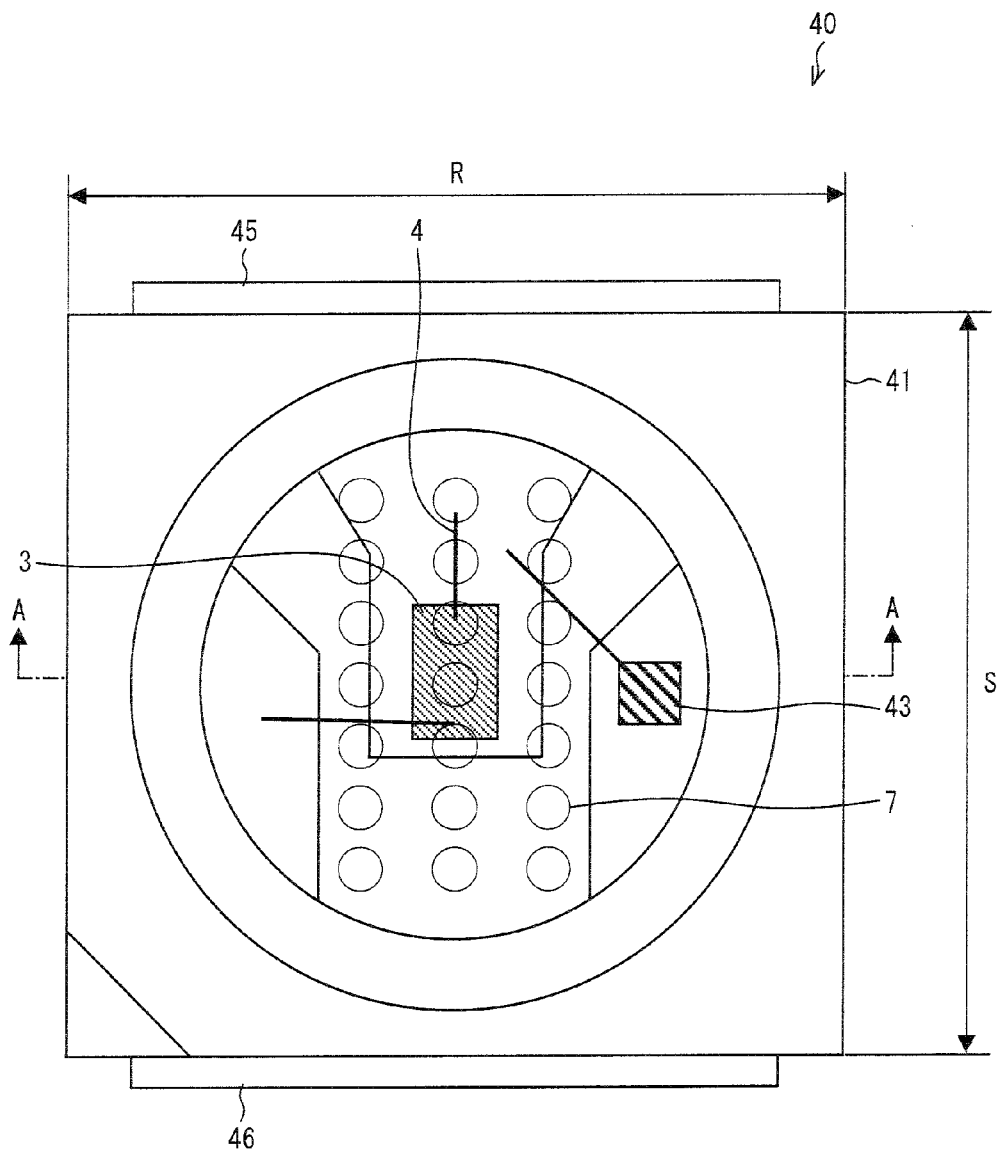
FIG. 16 is a top view showing the light-emitting apparatus.

FIG. 15 is a cross sectional view showing one example of a configuration of a light-emitting apparatus 40 in accordance with the present embodiment. FIG. 16 is a top view showing the light-emitting apparatus 40 shown in FIG. 15.

The light-emitting apparatus 40 of the present embodiment is a surface-mounting light-emitting apparatus which outwardly emits light and in which a fluorescent material is uniformly dispersed in a light-transmissive resin. As shown in FIGS. 15 and 16, the light-emitting apparatus 40 includes (i) an insulating substrate 41 made from polyphthalamide (PPA), (ii) LED chips 3, (iii) wires 4, (iv) a protective element 43 made from an Si zener diode, (v) a layer containing the fluorescent material, and (vi) a color-adjusting fluorescent layer 7.

A light reflecting wall 42 is provided above the insulating substrate 41, which light reflecting wall 42 has a recess opening recessed downwardly from a top surface serving as an emission surface of the light-emitting apparatus 40. The insulating substrate 41 has a rectangular shape when viewed from above, and has a length S of, for example, 3.2 mm and a width R of 2.8 mm.

On the insulating substrate 41, a first electrode 45 and a second electrode 46 are formed on a bottom surface (i.e., a top surface of the insulating substrate 41) of the recess opening. Each of the first electrode 45 and the second electrode 46 is connected to an external electrode (which is not illustrated) so as to be able to be electrically connected to a power supply provided outside of the light-emitting apparatus 40.

On the first electrode 45, a LED chip 3 is provided and attached to the first electrode 45 via a silicone resin. On the second electrode 46, a protective element 43 is provided and attached to the second electrode 46 via a silver paste. The LED chip 3 has two electrodes, one of which is connected to the first electrode 45 via a wire 4 made of gold and the other of which is connected to the second electrode 46 via a wire 4 made of gold.

The protective element 43 has one electrode connected to the first electrode 45 via a wire 4, and the other electrode connected to the second electrode 46 via a silver paste. That is, the protective element 43 is connected to the first electrode 45 and the second electrode 46 in parallel with the LED chip 3.

Both the LED chip 3 and the protective element 43 are sealed by a fluorescent material-containing layer 44, which fills the recess opening in the insulation substrate 41. The fluorescent material-containing layer 44 contains a green fluorescent material and a red fluorescent material (each being a first fluorescent material), each of which absorbs blue light emitted from the LED chip 3 and emits fluorescent light. As such, light to be emitted from the light-emitting apparatus 40 has a white color. On the fluorescent material-containing layer 44 serving as the emission surface, the color-adjusting fluorescent layer 7 is formed.

(Manufacturing of Light-Emitting Apparatus)

Next, the following describes a method for manufacturing the light-emitting apparatus 40 having the configuration described earlier. Note that the method is explained, following a flow chart of FIG. 13, because the light-emitting apparatus 40 can be manufactured following the steps in the flow chart.

First, the LED chip 3 is mounted on the first electrode 45 that has been formed in a bottom surface of the recess opening in the insulating substrate 41, and the LED chip 3 is attached to the first electrode 45 via a silicone resin (step S 21). Then, a protective element 43 is mounted on the second electrode 46 having been formed in the bottom surface of the recess opening in the insulating substrate 41. The protective element 43 includes two electrodes, one of which is electrically connected to the second electrode 46 via a silver paste and fixed to the second electrode 46.

Subsequently, one of two electrodes of the LED chip 3 is connected to the first electrode 45 via a wire 4 made of gold, and the other one of the two electrodes of the LED chip 3 is connected to the second electrode 46 via a wire made of gold (step S 22). Also, the other one of the electrodes of the protective element 43 is electrically connected to the first electrode 45 via a wire 4 made of gold.

After the above, a silicone resin that contains a fluorescent material is introduced into the recess opening in the insulating substrate 41, and then kept at 150° C. for 3 hours so as to be cured (step S 23). This forms the fluorescent material-containing layer 44. This fluorescent material-containing layer 44 uniformly contains the fluorescent material in the silicone resin that is light-transmissive.

Note that the fluorescent material-containing layer 44 is obtained by mixing (i) the silicone resin that is light-transmissive with (ii) a first particulate fluorescent material made of a red fluorescent material $CaAlSiN_3$:Eu and a green fluorescent material $(Si.Al)_6(O.N)_8$:Eu. Here, a weight ratio of the first particulate fluorescent material to the silicone resin is 0.173.

The step following the step S 23 measures a color property of light emitted from the light-emitting apparatus which now includes the fluorescent material-containing layer 44 (step S 24). The color property of light emitted from the light-emitting apparatus can be measured by a measurement apparatus which adopts a d/8 (diffusion illumination 8° light receiving system) optical system conforming to the condition C of JIS 28722, DIN 5033 teil 7, ISOk772411.

For example, there is a case where, in the previous step (step S 23), the fluorescent material-containing layer 44 has been formed in the following process so that the fluorescent material-containing layer 44 will emit light of the color region (a2) which has coordinates (x, y)=(0.320, 0.330) in the CIE color coordinates shown in FIG. 14. The process in this case includes the steps of: introducing a mixture obtained by mixing the first particulate fluorescent material with the silicone resin serving as the fluid resin, at a weight ratio of 5:100; and curing the mixture at 150° C. for 30 minutes. In such a case, the light-emitting apparatus thus including the fluorescent material-containing layer 44 emits light of any one of the color regions (b), (a1), and (a2) shown in FIG. 14.

The light-emitting apparatus is categorized into one of color groups, based on the measurement of the light that is emitted from the light-emitting apparatus. Into the light-emitting apparatus which is categorized into the color group (a1) or (a2), the color-adjusting fluorescent layer 7 is formed on a surface (top surface) of the fluorescent material-containing layer 44 that serves as the emission surface, so that that the light emitted from the light-emitting apparatus will have a color property of the color region (b). That is, a resin liquid that contains the second particulate fluorescent material is applied onto the top surface of the fluorescent material-containing layer 44 (step S 25), which resin liquid later constitutes the color-adjusting fluorescent layer 7.

In the above case, in order that the light-emitting apparatus can emit light of the color region (b) having coordinates (x, y)=(0.345, 0.350) in the CIE color coordinates, a green fluorescent material, for example, is mixed with the silicone resin at a weight ratio of 2:100 so that a liquid containing the fluorescent material is produced. Then, the liquid is applied onto the fluorescent material-containing layer 44 by the ink jet printing method.

In the light-emitting apparatus categorized into the color group (a2), the liquid containing the fluorescent material is applied in 30 circular dots each having a diameter of 0.5 mm and provided at an interval of 0.34 mm. One the other hand, in the light-emitting apparatus categorized into the color group (a1), the liquid containing the fluorescent material is applied in 30 circular dots each having a diameter of 0.35 mm and provided at an interval of 0.34 mm. As seen in the above, the liquid containing the fluorescent material is applied in more dots in a light-emitting apparatus which emits light having a greater color shift.

Subsequently, the liquid containing the fluorescent material is cured at 150° C. for 1 hour, so that the color-adjusting fluorescent layer 7 is formed. A subsequent step measures, by use of the above-described measurement apparatus and in the same way as described above, a color property of light emitted from the light-emitting apparatus thus including the color-adjusting fluorescent layer 7 (step S 26). By this, it is confirmed that the light emitted from the light-emitting apparatus including the color-adjusting fluorescent layer 7 has the color of the color region (b). By the above processes, it is possible to manufacture light-emitting apparatuses 40 each being categorized into the color group (b). At last, the light-emitting apparatuses 40 are separated into individual light-emitting apparatuses (step S 27). By this, it is possible to manufacture a light-emitting apparatus 40 thus separated into an individual light-emitting apparatus.

As seen in the above, the light-emitting apparatus 40 includes the color-adjusting fluorescent layer 7 that has been formed in dots whose diameter is varied based on a color shift. Thus, it is possible to manufacture, at a good yield rate and a reduced cost, the light-emitting apparatus 40 that emits light having no color shift.

Note that the light-transmissive resin (light-transmissive member) for constituting the fluorescent material-containing layer 44 can be a light-transmissive resin having a good weather-resistance, such as an epoxy resin, a urea resin, a silicone resin, a modified epoxy resin, a modified silicone rein, or polyamide. Alternatively, in a case where the light-reflecting wall 42 is made from a material, such as AlN or ceramic, having a resistance to a high temperature, the light-transmissive member for constituting the fluorescent material-containing layer 44 can be a light-transmissive member such as a glass, instead of the light-transmissive resin.

Fifth Embodiment

Another embodiment of the present technology is described as follows, with reference to the drawings. Note that the present embodiment is the same as First through Fourth Embodiments described earlier, except a configuration described hereinafter. Note also that for convenience, members operating in the same ways as those shown in the drawings dealt with in any of First through Fourth Embodiments are given the same reference numerals, and explanations thereof are omitted.

Figure 17:
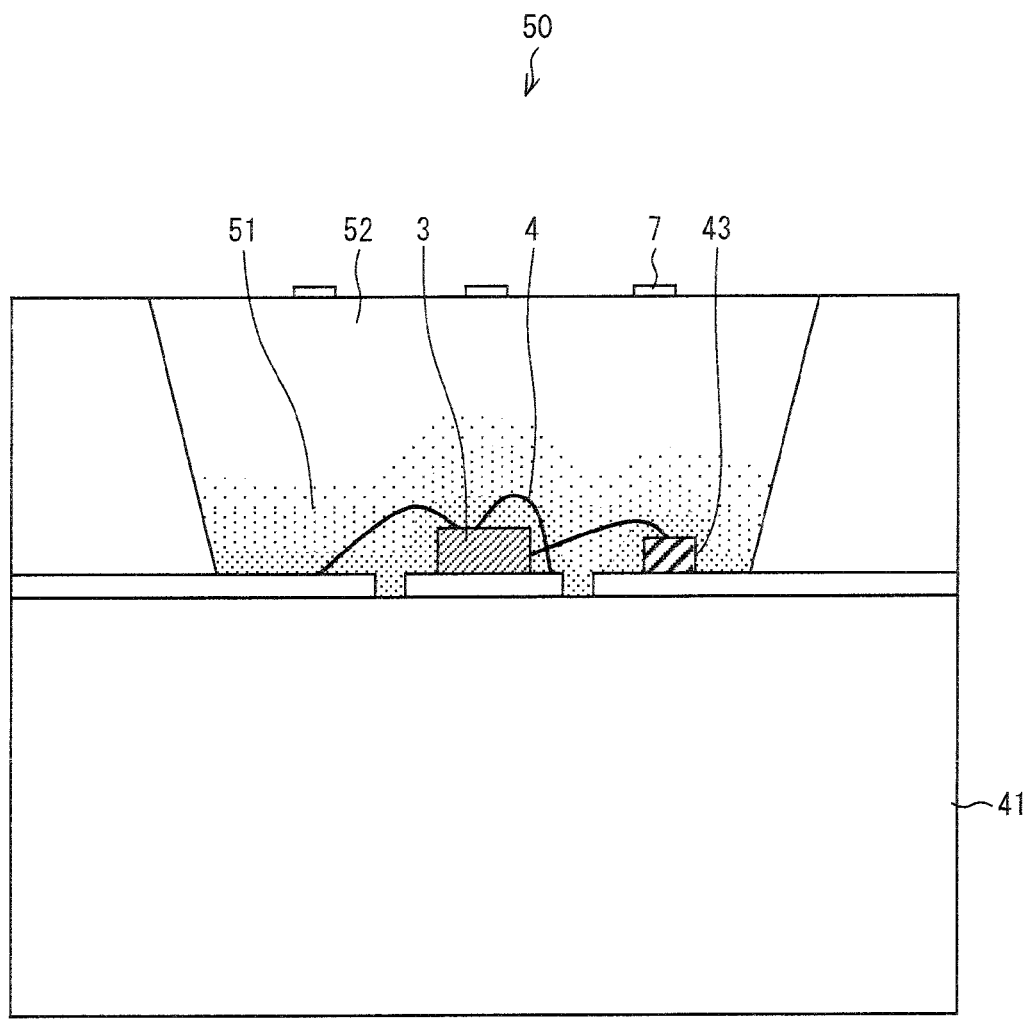
FIG. 17 is a cross sectional view showing a light-emitting apparatus in accordance with yet another embodiment.
Figure 18:
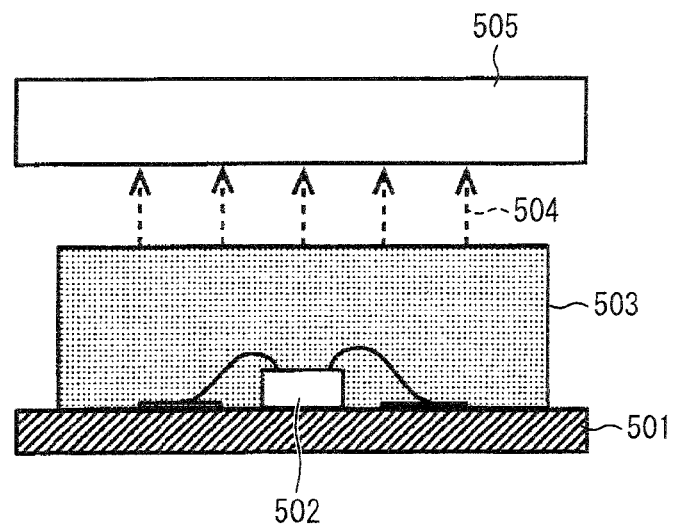
FIG. 18(a) is a view showing a step for manufacturing a conventional light-emitting apparatus.
FIG. 18(b) is a view showing a step for manufacturing the conventional light-emitting apparatus.
FIG. 18(c) is a view showing a step for manufacturing the conventional light-emitting apparatus.
Figure 18:
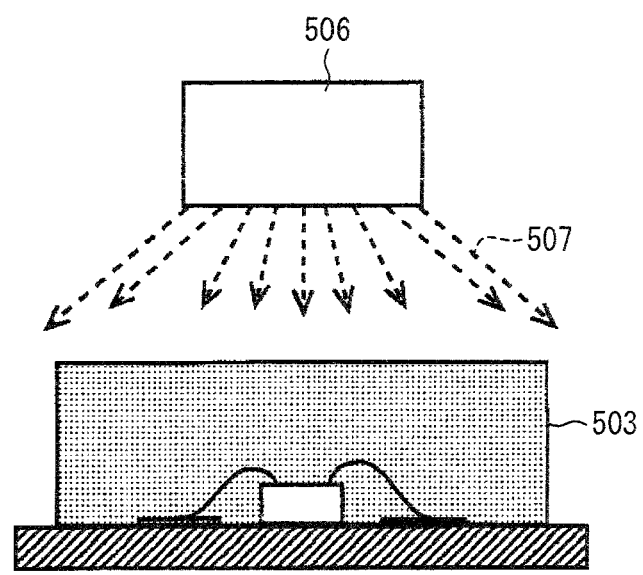
Figure 18:
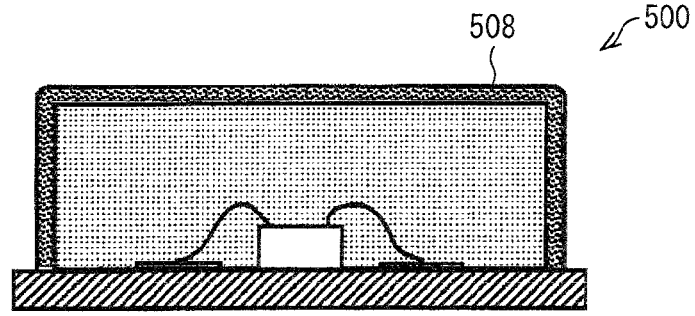

FIG. 17 is a cross sectional view showing one example of a configuration of a light-emitting apparatus 50 in accordance with the present embodiment. Note that, when being viewed from above, the light-emitting apparatus 50 shown in FIG. 17 has the same appearance as the light-emitting apparatus 40 shown in FIG. 16.

As shown in FIG. 17, the light-emitting apparatus 50 (fluorescent material settling-type light-emitting apparatus) of the present embodiment has the same configuration as the light-emitting apparatus 40 of Fourth Embodiment except in that the light-emitting apparatus 50 of the present embodiment includes (i) no fluorescent material-containing layer 44, (ii) a fluorescent material-containing layer 51, and (iii) a layer 52 having a less fluorescent material (less-fluorescent-material containing layer 52).

Note that the less-fluorescent-material containing layer 52 is a layer containing the fluorescent material by an amount of ½ or less of an amount of a fluorescent material contained in the fluorescent material-containing layer 44.

As the color adjusting method, there is proposed a method in which removal of the fluorescent layer is carried out by directly performing, to the fluorescent layer, (i) cutting, (ii) grinding, or (iii) mechanical treatment. However, such a method may have a problem in that the fluorescent layer leaves a residue or is blacked when the fluorescent layer is removed by performing, directly to the fluorescent layer, (i) cutting, (ii) grinding, or (iii) mechanical treating.

In contrast, in the present embodiment in which the color-adjusting fluorescent layer 7 is formed in dots, it is possible to carry out color adjustment having a higher accuracy but causing no such problem caused in removal of the fluorescent material. The light-emitting apparatus 50 in which the fluorescent material settles out near the LED chip 3 provides the same effect.

(Others)

In the descriptions provided earlier, the method for applying the resin liquid containing the fluorescent material, which resin liquid constitutes the color-adjusting fluorescent layer 7, can be the ink jet printing method. Alternatively, for example, the method can be a method in which the resin liquid is manually applied onto a tip of a needle, and then the resin liquid thus applied onto the tip of a needle is applied onto the surface of the light-emitting apparatus. In the above case in which the resin liquid is applied in dots, it is possible to adjust the color adjustment by changing the number of dots. Thus, it is possible to carry out a certain level of color adjustment even in a case where the application of the resin liquid is performed manually with a poor controllability.

It is described earlier that in the color-adjusting fluorescent layer 7, the green fluorescent material is contained. Alternatively, it can be configured such that in the color-adjusting fluorescent layer, a mixture of a green fluorescent material and a red fluorescent material are contained, or such that the color-adjusting fluorescent layer includes color-adjusting fluorescent layers formed separately, one of which color-adjusting fluorescent layers is formed by applying a resin liquid containing a green fluorescent material, and the other of which color-adjusting fluorescent layers is formed by applying a resin liquid containing a red fluorescent material.

In particular, in a case where the green fluorescent material and the red fluorescent material are separately applied, it is possible to realize color adjustment that is higher in accuracy, as compared with a case in which one fluorescent material is used. In the above case, it can be configured such that a color-adjusting fluorescent layer in which the red fluorescent material is contained is formed on a color-adjusting fluorescent layer in which the green fluorescent material is contained. Alternatively, dot positions can be arranged so that the respective color-adjusting fluorescent layers of the green and red fluorescent materials do no overlap with each other. In either case, in a configuration in which the color-adjusting fluorescent layer 7 is formed in dots, color adjustment by use of two or more color fluorescent materials is extremely easy.

In a case where the particulate fluorescent material is applied by the ink jet printing method, the chamber 103, in which the resin containing the fluorescent material is contained, can include a filter. Further, the ink jet apparatus can be an ink jet apparatus that laterally includes a chamber, in which a fluorescent material-containing resin is to be contained, so that (i) a particulate fluorescent material whose particles are heavier in weight and larger in diameter and/or (ii) a particulate fluorescent material whose particles form aggregation and are thereby heavier in weight can easily settle in the chamber 103.

The present technology is not limited to the description of the embodiment above, but may be altered by a skilled person within the scope of the claims. An embodiment based on a proper combination of technical means altered as appropriate within the scope of the claims is encompassed in the technical scope of the present technology.

For example, the color-adjusting fluorescent layer may be formed in accordance with a method which makes it possible to perform local or selective application. As such, the color-adjusting fluorescent layer can be formed by using an ink jet apparatus or a jet dispenser, but, in particular, it is the most preferable that the color-adjusting fluorescent layer be formed in accordance with the ink jet printing method using the ink jet apparatus. With the ink jet printing method, it is possible to locally apply the fluorescent material-containing liquid (color-adjusting fluorescent layer) containing the second fluorescent material, in dots whose number ranges from a few to tens. Therefore, it is possible to selectively provide the second fluorescent material in a desired area. Additionally, it is possible to selectively apply the fluorescent material-containing liquid (color-adjusting fluorescent layer) containing the second fluorescent material, by a given amount. Therefore, it is possible to more accurately perform fine color adjustment.

In consideration of the above, it is desirable that the light-emitting apparatus of the present technology be configured such that the color-adjusting fluorescent layer is formed by applying the fluorescent material-containing liquid containing the second fluorescent material, in accordance with the ink jet printing method. On the other hand, it is preferable that the method according to the present technology for manufacturing the light-emitting apparatus be configured such that the step (iii) includes the sub-steps of: applying the fluorescent material-containing liquid containing the second fluorescent material, in dots in accordance with the ink jet printing method; and forming the color-adjusting fluorescent layer by curing the fluorescent material-containing liquid thus applied.

Furthermore, it is preferable that the light-emitting apparatus of the present technology further includes, between the fluorescent material-containing layer and the color-adjusting fluorescent layer, a layer containing no fluorescent material (no-fluorescent material-containing layer) or a layer containing a less amount of a fluorescent material (less-fluorescent material-containing layer). Further, it is preferable that the method according to the present invention further includes, between the steps (ii) and (iii), the step of forming the no-fluorescent material-containing layer or the less-fluorescent material-containing layer.

Also, it is preferable that the light-emitting apparatus of the present technology be configured such that the first fluorescent material contains at least a green fluorescent material and a red fluorescent material, and that the second fluorescent material contains at least the green fluorescent material. By this, it is possible to prevent a deterioration in brightness of light emitted from the light-emitting apparatus and to easily shift, to a given color, a color of the light emitted from the light-emitting apparatus.

On the other hand, it is preferable that the method according to the present technology be configured so that the color-adjusting fluorescent layer is formed in dots whose number is increased or decreased based on the color property measured in the step (ii), and that the color-adjusting fluorescent layer is formed in dots whose size is increased or decreased based on the color property measured in the step (ii). By this, it is possible to extremely minutely perform the color adjustment.

Additionally, it is preferable that the light-emitting apparatus of the present technology be configured such that the second fluorescent particle is powder and coated with a first light-transmissive resin that is in a solid state. Further, it is preferable that the method according to the present invention be arranged so that the second fluorescent material is powder and coated with a light-transmissive resin that is in a solid state. By these, it is possible to reduce aggregation of particles of the fluorescent material, and to uniform a fluorescent material concentration in the coating liquid.

Note that it is preferable that a particle of powder being made of the second fluorescent material coated with the first light-transmissive resin contain one to three particles of the second fluorescent material, so that it is possible to prevent a case in which the particles of the powder become too large and causes clogging of a nozzle, e.g., the nozzle of the ink jet apparatus, via which the second fluorescent material is discharged during the step of forming the color-adjusting fluorescent layer.

Moreover, it is preferable that the light-emitting apparatus of the preset technology be configured such that a particle of powder being made of the second fluorescent material coated with the first light-transmissive resin have a spherical shape or an oval shape. Further, it is preferable that the method according to the present invention be arranged such that a particle of powder being made of the second fluorescent material coated with the light-transmissive resin have a spherical shape or an oval shape.

By the above, because each of the particles of the powder has the spherical shape or the oval shape, the particles of the powder can be uniform in shape and diameter. Thus, it is possible to reduce the wearing-off of a nozzle, e.g., the nozzle of the ink jet apparatus, via which the second fluorescent material is discharged in the step of forming the color-adjusting fluorescent layer. Additionally, because the particles having the spherical shape or the oval shape can be stably discharged, it is possible to suitably control a thickness or dimensions of the color-adjusting fluorescent layer to be formed.

Furthermore, it is preferable that the light-emitting apparatus of the present technology be configured such that the color-adjusting fluorescent layer be formed from (i) the powder being made of the second fluorescent material coated with the first light-transmissive resin, and (ii) a second light-transmissive resin.

The example embodiments presented herein can be suitably used not only (i) in a field of a light-emitting apparatus that includes a light-emitting element in combination with a fluorescent material but also (ii) in a field of a method for manufacturing the light-emitting apparatus. In the filed of the method, the present embodiments can be particularly suitably used in a filed related to a method for carrying out color adjustment. Furthermore, the present embodiments can be widely used in (i) a field of a variety of electrical apparatuses, such as a mobile telephone including the light-emitting apparatus, and (ii) a field of a method for manufacturing the variety of the electrical apparatuses.

BRIEF DESCRIPTION OF REFERENCE NUMERALS

1. Substrate
2. First surface (mounting surface)
3. LED chip (light-emitting element)
4. Wire
5. Layer that contains fluorescent material (fluorescent material-containing layer)
6. Light-transmissive silicone resin layer (layer containing no fluorescent material, no-fluorescent material-containing layer)
7. Color-adjusting fluorescent layer
10, 10a, 10b, 30, 30a, 40, 50. Light-emitting apparatus
21. Resin powder that contains green fluorescent material
22. Fluid light-transmissive silicone resin
23. Applying liquid of color-adjusting fluorescent material
41. Insulating substrate (substrate)
43. Protective element
44. Layer that contains fluorescent material (fluorescent material-containing layer)
51. Layer that contains fluorescent material (fluorescent material-containing layer)
52. Layer that contains less fluorescent material (less-fluorescent material-containing layer)

What is claimed is:

1. A light-emitting apparatus comprising:
   a substrate;
   a plurality of light-emitting elements mounted on a mounting surface of the substrate;
   a fluorescent material-containing layer comprising a resin containing a first fluorescent material; and
   a plurality of color-adjusting fluorescent layers containing a second fluorescent material, wherein:
      the fluorescent material-containing layer is plate-like, and is provided on the mounting surface of the substrate so as to directly cover the plurality of light-emitting elements and to be in contact with a side surface of each of the plurality of light-emitting elements; and
      the plurality of color-adjusting fluorescent layers are provided on a surface of the fluorescent material-containing layer in an island-like manner so as to cover only a portion of the surface of the fluorescent material-containing layer.

2. The light-emitting apparatus as set forth in claim 1, wherein,
   in a planar view, a portion of the plurality of color-adjusting fluorescent layers or all of the plurality of color-adjusting fluorescent layers overlap with the plurality of light-emitting elements.

3. The light-emitting apparatus as set forth in claim 1, wherein,
   in a planar view, a shape of the fluorescent material-containing layer is either a hexagon, a circle, a rectangle, or a square.

4. A method for manufacturing a light-emitting apparatus as set forth in claim 1, wherein
   the method comprises a step of providing the plurality of color-adjusting fluorescent layers on the surface of the fluorescent material-containing layer in an island-like manner by an ink jet printing method.

* * * * *